(12) United States Patent
Kimura et al.

(10) Patent No.: US 6,930,328 B2
(45) Date of Patent: Aug. 16, 2005

(54) SEMICONDUCTOR DEVICE AND METHOD OF MANUFACTURING THE SAME

(75) Inventors: Hajime Kimura, Kanagawa (JP); Aya Anzai, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/410,600

(22) Filed: Apr. 10, 2003

(65) Prior Publication Data

US 2003/0230763 A1 Dec. 18, 2003

(30) Foreign Application Priority Data

Apr. 11, 2002 (JP) ........................................ 2002-109164

(51) Int. Cl.[7] .............................................. H01L 29/04
(52) U.S. Cl. ............................. 257/72; 257/59; 257/72; 257/347; 257/348; 257/349; 257/350; 257/408; 438/166
(58) Field of Search ............................ 257/59, 72, 347, 257/348, 349, 350, 408; 438/166

(56) References Cited

U.S. PATENT DOCUMENTS

| 5,943,593 A | 8/1999 | Noguchi et al. |
|---|---|---|
| 6,057,183 A | 5/2000 | Koyama et al. |
| 6,229,506 B1 | 5/2001 | Dawson et al. |
| 6,274,885 B1 * | 8/2001 | Yamazaki et al. ............ 257/59 |
| 6,723,590 B1 * | 4/2004 | Zhang et al. ............... 438/166 |
| 6,737,717 B2 * | 5/2004 | Yamazaki et al. .......... 257/408 |
| 2003/0155612 A1 | 8/2003 | Kawachi et al. |

FOREIGN PATENT DOCUMENTS

| EP | 1 102 234 A2 | 5/2001 |
|---|---|---|
| EP | 1103946 A2 | 5/2001 |
| EP | 1103946 A2 | 5/2001 |
| JP | 2756530 | 3/1998 |
| JP | 11-219146 | 8/1999 |
| JP | 2001-147659 | 5/2001 |
| JP | 2001-343633 | 12/2001 |

* cited by examiner

Primary Examiner—David Nelms
Assistant Examiner—Mai-Huong Tran
(74) Attorney, Agent, or Firm—Fish & Richardson P.C.

(57) ABSTRACT

To obtain a semiconductor device and a method of manufacturing the same which can reduce influence of fluctuation in characteristic among transistors due to fluctuation in laser light irradiation number and laser light intensity on a semiconductor. There is provided a semiconductor device with plural pixels having transistors forming a matrix pattern, in which: the transistors have semiconductors crystallized by laser light irradiation; the semiconductors stretch over at least two pixels; the length of each of the semiconductors is longer than the pixel pitch of the pixels; and when the scan pitch of the laser light is given as M and the pixel pitch of the pixels is given as N, the semiconductors are irradiated with the laser light N/M times or more.

22 Claims, 35 Drawing Sheets

FIG. 10A
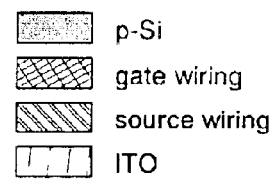
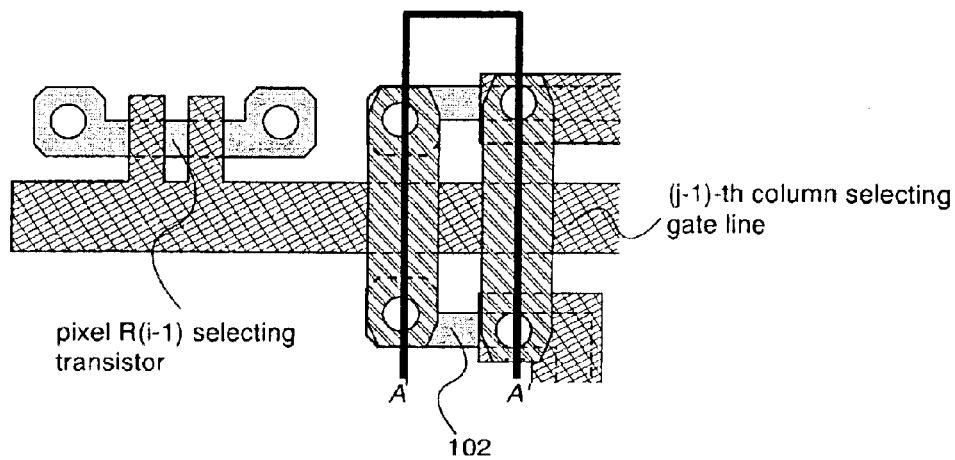
FIG. 10B
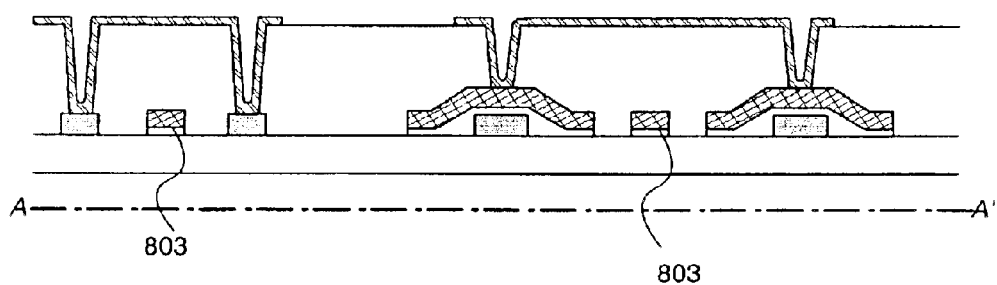

p-Si
gate wiring
source wiring
ITO (j+1)-th column source line  1201

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. Specifically, the present invention relates to a semiconductor device in which a transistor is formed from a polycrystalline semiconductor crystallized by laser light irradiation and to a method of manufacturing the semiconductor device. The invention also relates to a semiconductor device which uses the above transistor in its pixel and to a method of manufacturing the semiconductor device.

2. Description of the Related Art

In recent years, portable equipment such as PDAs, cellular phones, and notebook computers have grown popular. Such equipment has flat panel displays mounted thereto. Flat panel displays employed often are STN liquid crystal displays, amorphous silicon TFT (amorphous silicon thin film transistor) liquid crystal displays, and the like. However, lately these displays have been taken over by low temperature polysilicon (polycrystalline silicon) TFT liquid crystal displays in which driving circuits are built on glass substrates. In near future, even they will be replaced by light emitting displays (e.g., EL displays) that use low temperature polysilicon TFTs as major flat panel displays mounted to portable equipment.

An example of a pixel circuit in a light emitting display is shown in FIG. 26, and the operation thereof will be described briefly. The pixel circuit shown in FIG. 26 controls a current flowing into a light emitting element 2602 (hereinafter referred to as light emission current) by controlling Vgs (gate-source voltage) of a driving transistor 2601. The value of the light emission current and the luminance of the light emitting element are in proportion to each other. Therefore, the luminance of the light emitting element can be controlled by controlling the light emission current.

Light emitting elements can be formed of a wide range of materials including organic materials, inorganic materials, and bulk materials. Among them, a typical light emitting element is an organic light emitting diode (OLED), which is mainly composed of organic materials. A light emitting element is structured to have an anode, a cathode, and a light emitting layer which is sandwiched between the anode and the cathode. A light emitting layer is formed of one or more materials chosen from the above materials. Luminescence provided by light emitting layers is divided into light emission upon return to the base state from singlet excitation (fluorescence) and light emission upon return to the base state from triplet excitation (phosphorescence). The present invention is applicable to a case in which one of the two types of light emission is used as well as a case in which both types of light emission is used.

FIG. 27A is a circuit diagram of a circuit composed of the light emitting element 2602 and the driving transistor 2601. FIG. 27B shows the relation between Vgs (gate-source voltage) of the driving transistor 2601 and the light emission current. In FIG. 27B, there are two curves indicating that the characteristic of one driving transistor 2601 is different from the characteristic of another driving transistor 2601. When the driving transistor 2601 is fluctuated in characteristic as shown in FIG. 27B, the light emission current is also fluctuated even though Vgs stays the same level. Accordingly, fluctuation in characteristic of the driving transistor 2601 has to be avoided in order to display an image in accurate gray scales. It is impossible to display an image in correct gray scales if mobility, threshold, and other characteristics of the driving transistor 2601 are fluctuated.

On the other hand, low temperature polysilicon TFTs are distinctively high-performance TFTs formed on glass substrates. In order to enhance the performance of a TFT, the crystallinity of a semiconductor (specifically a channel formation region) in the transistor has to be improved.

A widely used method for improving the crystallinity of a semiconductor is to irradiate an amorphous state semiconductor with laser light and crystallize the semiconductor (polycrystallization or making amorphous silicon into polysilicon). According to this method, only a portion irradiated with laser light receives high energy and therefore unnecessarily subjecting the entire substrate to high temperature can be avoided. A TFT formed by this method is called a low temperature polysilicon TFT.

A TFT formed by a method in which a semiconductor layer is crystallized by thermal annealing is called a high temperature polysilicon TFT.

In many cases, a laser used in forming a low temperature polysilicon TFT is an excimer laser and its laser light is shaped into a linear shape before irradiating a glass substrate. The entire glass substrate is irradiated with the laser light by running the linear laser light over the substrate.

FIG. 28 is a schematic diagram of laser light irradiation. A linear laser 2801 is scanned (irradiated) in Direction x. In FIG. 28, the linear laser irradiates parallel to the source driver and scanning by the laser is moved in parallel to the gate driver. Such laser light irradiation method is described in, for example, JP 2756530 B.

The description given next is about how pixels are arranged into a matrix pattern in a pixel portion. In a pixel region 2802 of FIG. 28, plural pixels are arranged to form a matrix pattern. If the pixel portion is for displaying a monochrome image, the pixels are placed at regular intervals in the longitudinal direction and the lateral direction both. On the other hand, if the pixel portion is for displaying a color image, there are various ways to arrange R pixels, G pixels, and B pixels.

Methods of arranging pixels for R color, pixels for G color, and pixels for B color are described with reference to FIGS. 29A and 29B. FIG. 29A shows a longitudinal stripe arrangement in which pixels for the same color are lined up longitudinally. FIG. 29B shows a delta arrangement in which pixels on one row and pixels on the next row are staggered by half a sub-pixel.

In the longitudinal stripe arrangement, the length of a stripe of R color pixels in the lateral direction is one third the length of this stripe in the longitudinal direction. The same applies to a stripe of G color pixels and a stripe of B color pixels. If an R color pixel, a G color pixel, and a B color pixel together make one pixel, the length of this pixel in the longitudinal direction is equal to the length of the pixel in the lateral direction to form a square shape. In other words, a pixel pitch N of one pixel in the longitudinal direction is equal to a pixel pitch N of the one pixel in the lateral direction. In the delta arrangement, the length of an R color pixel (sub-pixel) in the longitudinal direction is the same as its length in the lateral direction. The same applies to a G color pixel (sub-pixel) and a B color pixel (sub-pixel). In other words, an R color pixel (sub-pixel), a G color pixel (sub-pixel), and a B color pixel (sub-pixel) each have a square shape.

As has been described, a semiconductor crystallized by linear laser light irradiation is used in a low temperature polysilicon TFT. Here, referring to the laser light intensity distribution (FIG. 30), a description is given on the operation of a linear laser when a semiconductor is irradiated with laser light by running the linear laser over the semiconductor.

First, one point in a semiconductor is irradiated with a linear laser. The laser light intensity distribution at this stage often forms a hill shape as shown in FIG. 30. An example thereof is Gaussian distribution. Thereafter, the laser light irradiation position is moved in Direction x by a laser scan pitch M to irradiate the semiconductor with the linear laser again. Then the laser light irradiation position is once more moved in Direction x to proceed laser light irradiation. The same operation is repeated to irradiate the entire glass substrate with the laser.

In this laser light irradiation, some regions of the semiconductor are irradiated with the laser light many times whereas some other regions are irradiated with the laser light only a few times depending on where they are located in Direction x (the laser scanning direction) as shown in FIG. 30. In short, the laser light irradiation number varies from one region of the semiconductor to another.

Furthermore, the intensity of laser light emitted from a laser is not constant but is fluctuated. This means that regions of a semiconductor cannot be irradiated uniformly with laser light even if they receive the same number of laser light irradiation.

When the number of laser light irradiation and the laser light intensity are varied from one region of a semiconductor to another, the crystallinity of the semiconductor crystallized by the laser is also fluctuated. Transistors formed from a semiconductor that has uneven crystal state are fluctuated in characteristic.

If transistors that are fluctuated in characteristic are used to manufacture a light emitting display, the driving transistor 2601 of one pixel and the driving transistor 2601 of another pixel exhibit different characteristics. Such light emitting display is incapable of displaying an image in accurate gray scales.

FIG. 31 shows the light emitting display which is displaying an uneven image because of the influence of fluctuation in characteristic of the driving transistor 2601. This uneven image is due to varying laser light irradiation number and laser light intensity, which differ from one point to another in Direction x (the laser scanning direction) of the semiconductor. As a result, streaks parallel to Direction y appear showing laser light irradiation tracks. This type of image unevenness is hereinafter referred to as laser fringes.

SUMMARY OF THE INVENTION

The present invention has been made in view of the above, and an object of the present invention is therefore to provide a semiconductor device free of the above problems and a method of manufacturing the semiconductor device. Specifically, an object of the present invention is to provide a semiconductor device and a method of manufacturing the same which can reduce influence of fluctuation in characteristic among transistors due to fluctuation in laser light irradiation number and laser light intensity on a semiconductor. Another object of the present invention is to provide a semiconductor device with less laser fringes and a method of manufacturing the semiconductor device.

In order to solve the above problems, according to the present invention, there is provided a semiconductor device with plural pixels having transistors forming a matrix pattern, characterized in that:

the transistors have semiconductors crystallized by laser light irradiation; and each channel formation region of the transistors is placed so as to be parallel to the laser scanning direction.

According to the present invention, there is provided a semiconductor device with plural pixels having transistors, the pixels and the wires forming a matrix pattern, characterized in that:

the transistors have semiconductors crystallized by laser light irradiation; and each channel formation region of the transistors is placed so as to be parallel to the laser scanning direction and to stretch over a region longer than the pixel pitch.

According to the present invention, there is provided a semiconductor device with plural transistors forming a matrix pattern, characterized in that:

the transistors have semiconductors crystallized by laser light irradiation;

each channel formation region of the plural transistors is placed so as to stretch in a first direction;

of the plural transistors, at least two transistors adjacent to each other in a second direction that is perpendicular to the first direction have a positional relation that makes them staggered in the second direction; and of the semiconductors of the plural transistors, at least two semiconductors adjacent to each other in the second direction have the same crystal state.

According to the present invention, there is provided a semiconductor device with plural pixels having transistors forming a matrix pattern, characterized in that:

the transistors have semiconductors crystallized by laser light irradiation;

the semiconductors stretch over at least two pixels;

the length of each of the semiconductors is longer than the pixel pitch of the pixels; and when the scan pitch of the laser light is given as M and the pixel pitch of the pixels is given as N, the semiconductors are irradiated with the laser light N/M times or more.

According to the present invention, there is provided a method of manufacturing a semiconductor device, including:

irradiating semiconductors with laser light for crystallization; and forming transistors from the crystallized semiconductors and arranging the transistors into a matrix pattern, the method being characterized in that:

each channel formation region of the plural transistors is placed so as to stretch in a first direction;

of the plural transistors, at least two transistors adjacent to each other in a second direction that is perpendicular to the first direction have a positional relation that makes them staggered in the second direction; and of the semiconductors of the plural transistors, at least two semiconductors adjacent to each other in the second direction have the same crystal state.

According to the present invention, there is provided a method of manufacturing a semiconductor device, including:

irradiating semiconductors with laser light for crystallization;

forming transistors from the crystallized semiconductors; and forming pixels from the transistors and arranging the pixels into a matrix pattern, the method being characterized in that:

the semiconductors stretch over at least two pixels;

the length of each of the semiconductors is longer than the pixel pitch of the pixels; and when the scan pitch of the laser light is given as M and the pixel pitch of the pixels is given as N, the semiconductors are irradiated with the laser light N/M times or more.

In the present invention, semiconductors are placed in parallel to Direction x (the laser light scanning direction) to even out fluctuation in characteristic between a transistor in one point in Direction x (the laser light scanning direction) and a transistor in another point. By arranging transistors in parallel to Direction x (the laser light scanning direction), channel formation regions of the transistors are irradiated with a laser in an increased number of times. This reduces fluctuation in laser light irradiation number and accordingly reduces fluctuation in crystal state between the semiconductors. Influence of fluctuation in characteristic among the transistors having the above semiconductors thus can be lowered.

Furthermore, in the present invention, each semiconductor is arranged so as to stretch over at least two pixels in order to increase the number of times the semiconductor is irradiated with the laser. This makes the length of the semiconductor larger than the pixel pitch of the pixels. By thus increasing the transistor size and, for example, setting a channel length L larger than the channel width, fluctuation in transistor itself can be reduced.

The width and length of laser light and the laser scan pitch in irradiating the semiconductors are not particularly limited. However, since the semiconductors are irradiated with a laser an increased number of times in the present invention, widening the laser light and measures to the similar effect are preferable. This makes it possible to further reduce fluctuation in crystal state between the semiconductors. If each semiconductor is sufficiently long, the laser light irradiation number for each semiconductor can be satisfactorily large and fluctuation among transistors is reduced even when the laser scan pitch is somewhat larger. In this way, a semiconductor device is manufactured without increasing the total number of laser light irradiation for irradiating the entire pixel portion. As a result, processing speed in manufacture of a semiconductor device is raised and therefore the cost is lowered.

BRIEF DESCRIPTION OF THE DRAWINGS

In the accompanying drawings:

FIGS. 10A and 10B are a top view of circuits of the present invention and a sectional view thereof;

DETAILED DESCRIPTION OF THE PREFERRED EMBODIMENTS

Embodiment Mode 1

Figure 1:
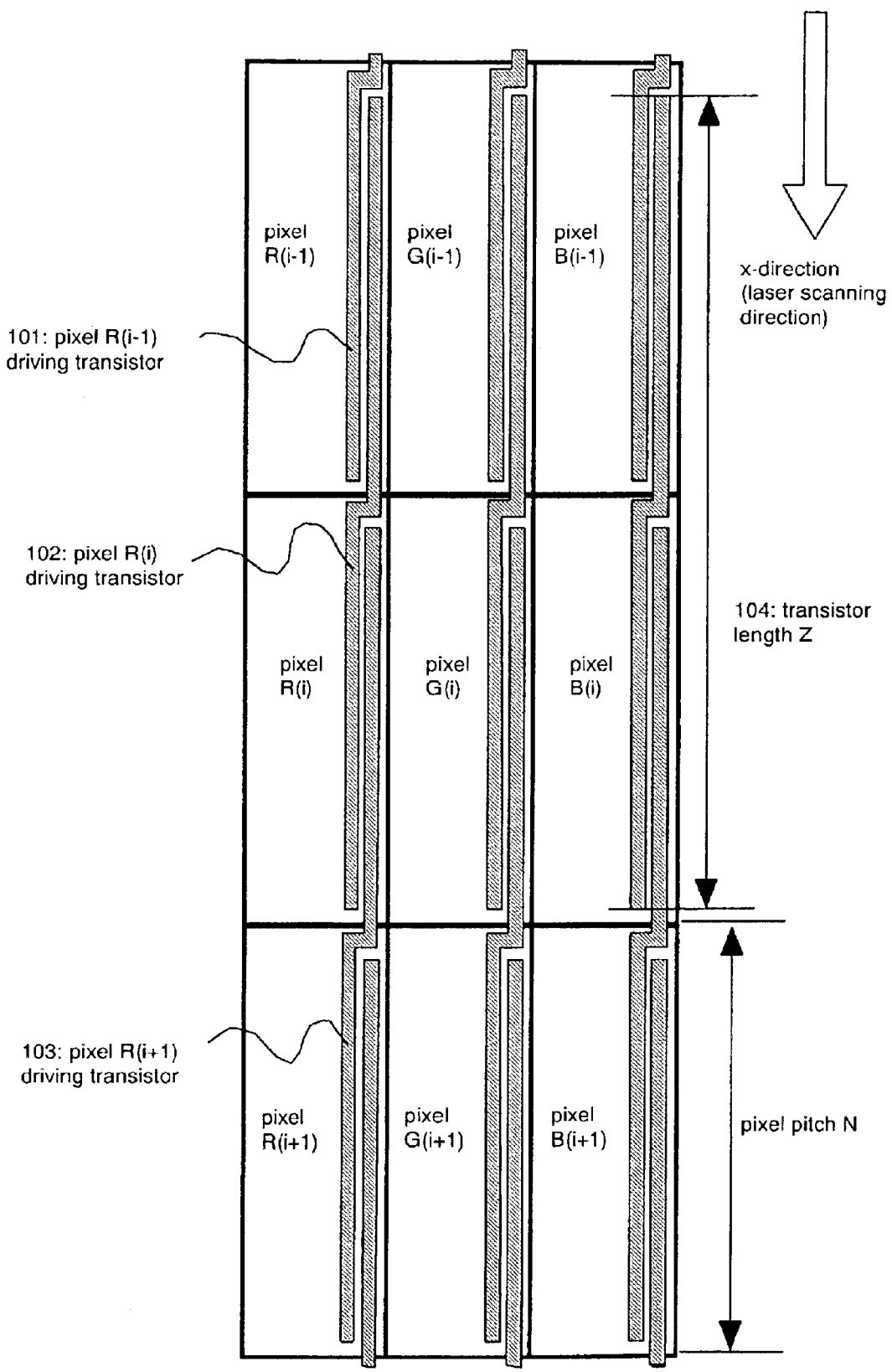
FIG. 1 is a schematic diagram showing arrangement of transistors of the present invention.

An embodiment mode of a semiconductor device according to the present invention will be described with reference to FIGS. 1 to 6. FIG. 1 is a schematic diagram of arrangement of transistors in pixels. FIG. 1 shows three pixels for red, green, and blue arranged in accordance with the stripe arrangement. However, the number of pixels in FIG. 1 will be nine if one pixel is to have one color. For discrimination, the R color portion of the first pixel from the top of FIG. 1 is referred to as pixel R(i−1), the G color portion thereof is pixel G(i−1), and the B color portion thereof is pixel B(i−1). Similarly, the R color portion of the second pixel from the top is referred to as pixel R(i), the G color portion thereof is G(i), and the B color portion thereof is pixel B(i). The R color portion of the third pixel from the top is referred to as pixel R(i+1), the G color portion thereof is G(i+1), and the B color portion thereof is pixel B(i+1).

Each pixel has transistors. For instance, the pixel R(i−1) has a transistor for driving a light emitting element of the pixel. This transistor is called a pixel R(i−1) driving transistor 101. Similarly, the pixel R(i) has a pixel R(i) driving transistor 102, and the pixel R(i+1) has a pixel R(i+1) driving transistor 103. The same applies to the rest of the pixels.

In this embodiment mode, a driving transistor of each pixel is extended to a region of a surrounding pixel as shown in FIG. 1. To be specific, the pixel R(i+1) driving transistor 103 is extended to a region of the pixel R(i). Similarly, the pixel R(i) driving transistor 102 is extended to a region of the pixel R(i−1). Thus a driving transistor of one pixel is placed not only on the one pixel but also on a region of a surrounding pixel.

The length of a driving transistor can therefore be set larger than the pixel pitch. Thus, the laser scanning direction and a direction in which the channel formation region of a transistor stretches can be made parallel to each other, whereby the number of times each driving transistor is irradiated with laser light is increased. Therefore fluctuation in characteristic among transistors is reduced.

Figure 30:
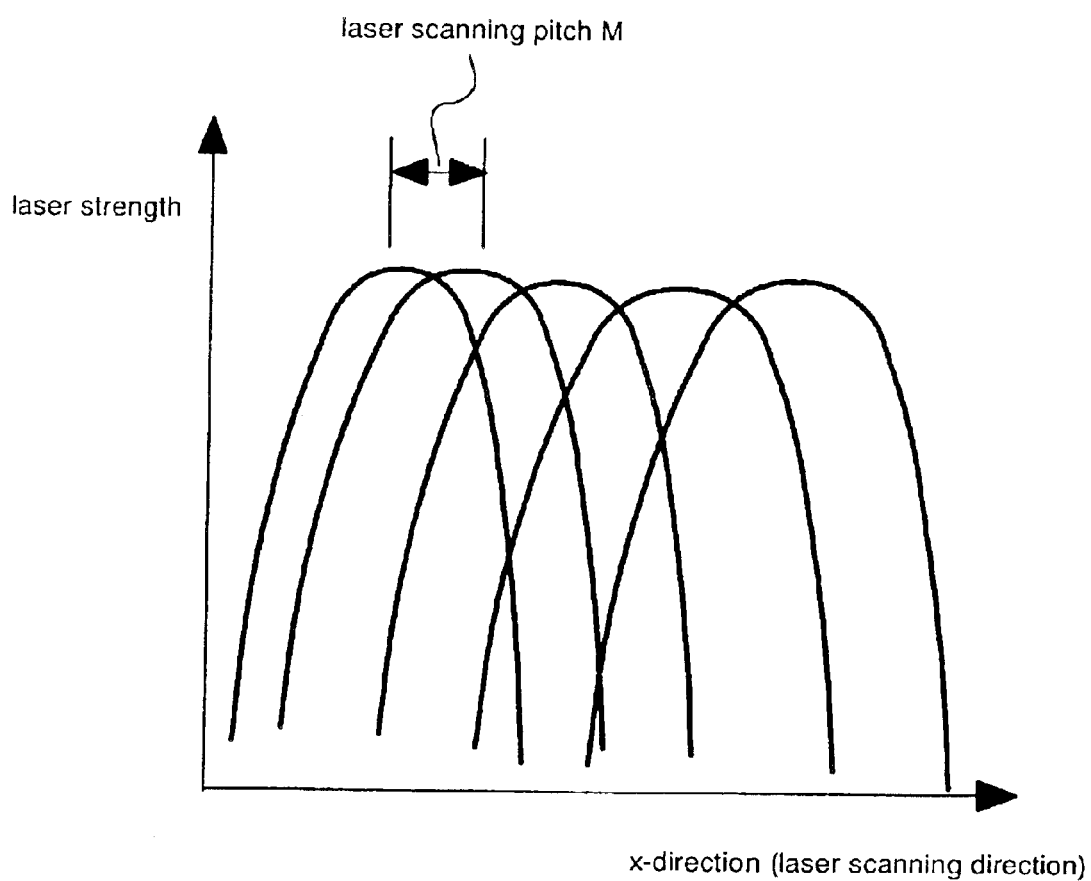
FIG. 30 is an intensity distribution diagram of conventional laser light.
Figure 31:
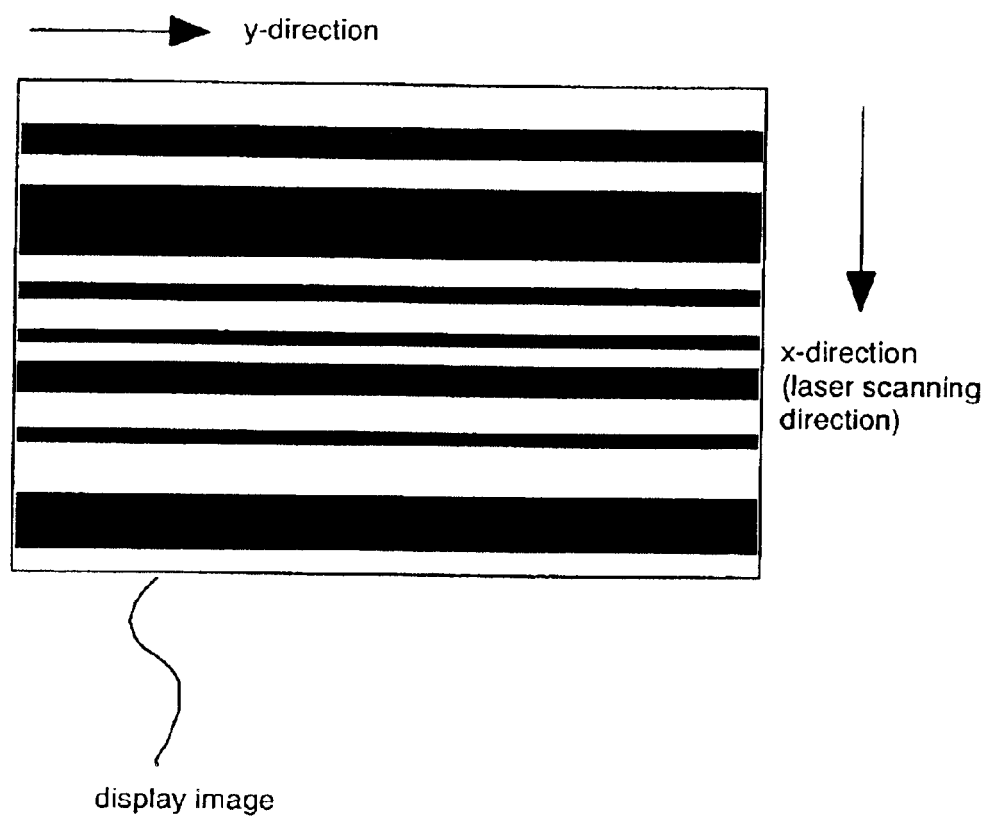
FIG. 31 is a diagram illustrating a display screen of a conventional semiconductor device.
Figure 32:
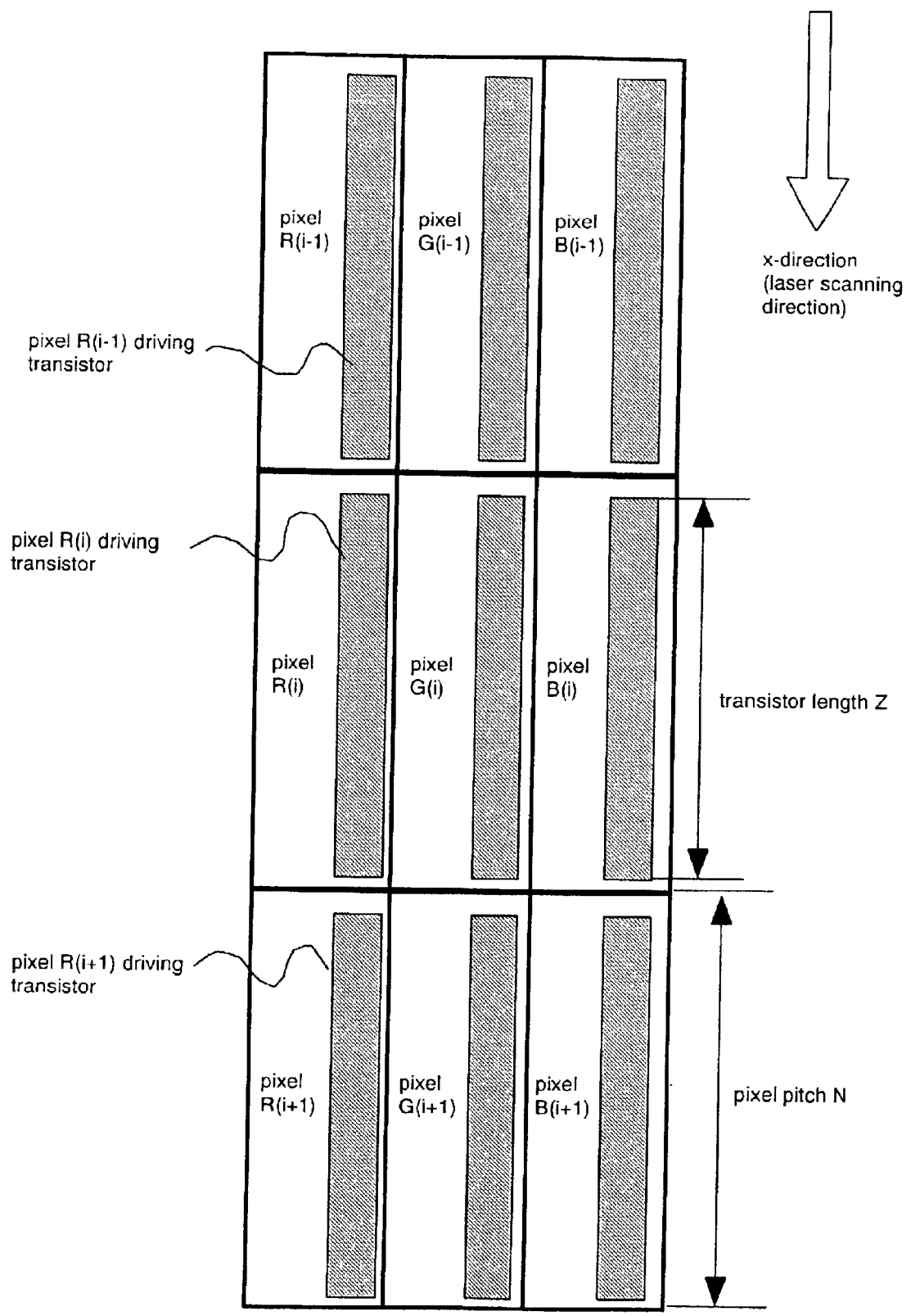
FIG. 32 is a schematic diagram showing arrangement of transistors of prior art.
Figure 33A:
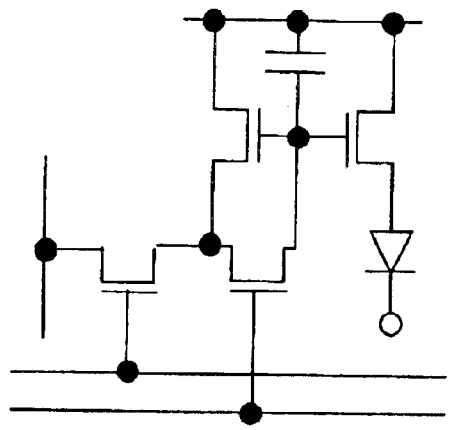
FIGS. 33A and 33B are diagrams showing arrangement of pixels of prior art.
Figure 33B:
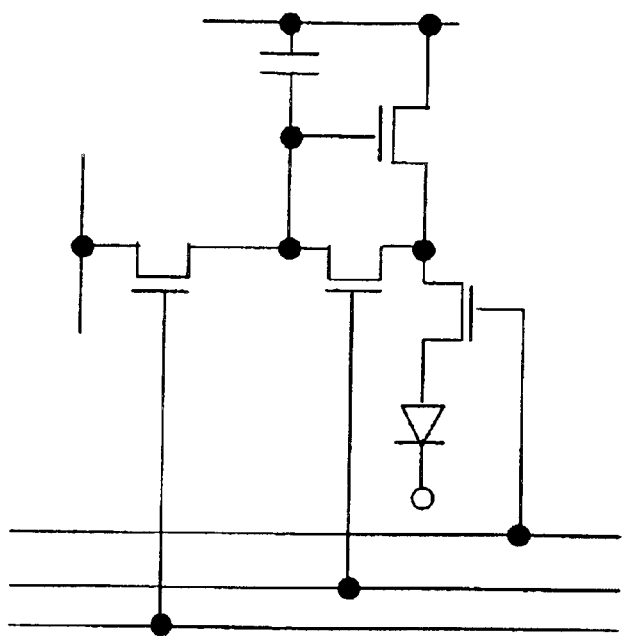
Figure 34A:
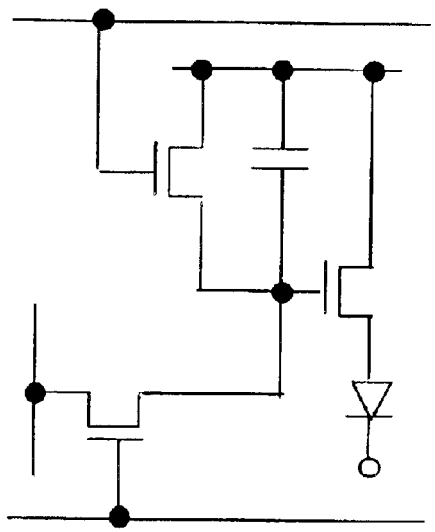
FIGS. 34A and 34B are diagrams showing arrangement of pixels of prior art.
Figure 34B:
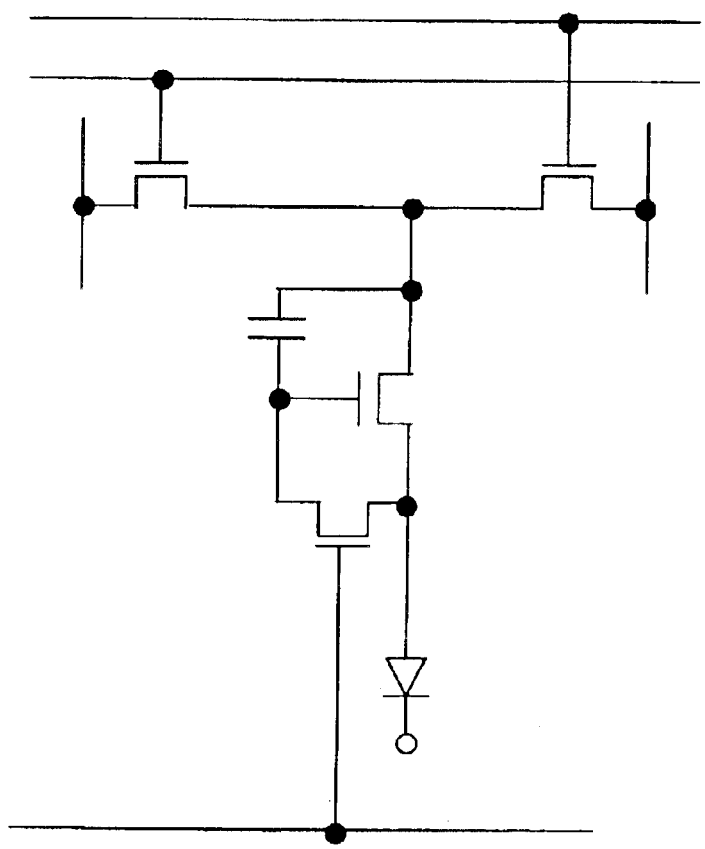

Here, as shown in FIG. 30, the laser scan pitch is given as M, and the pixel pitch as N. As shown in FIG. 1, the transistor length 104 is given as Z. Then one transistor is irradiated with laser light Z/M times. Since Z>N, Z/M is larger than N/M (Z/M>N/M).

According to the present invention, the number of times a transistor is irradiated with laser light is thus increased and therefore fluctuation in characteristic among transistors can be reduced. Further, if the transistor length Z is sufficiently long, the laser scan pitch M can be set slightly larger than that in prior art. This makes it possible to reduce the laser light irradiation number for irradiating the entire pixel portion. However, in FIG. 1, the transistor length Z starts in one pixel and ends in an adjacent pixel, meaning that the scan pitch M is preferably set twice or less in order to increase the number of times the transistor is irradiated. As a result, processing speed in manufacture of a semiconductor device is raised and manufacture cost is accordingly lowered.

Figure 2:
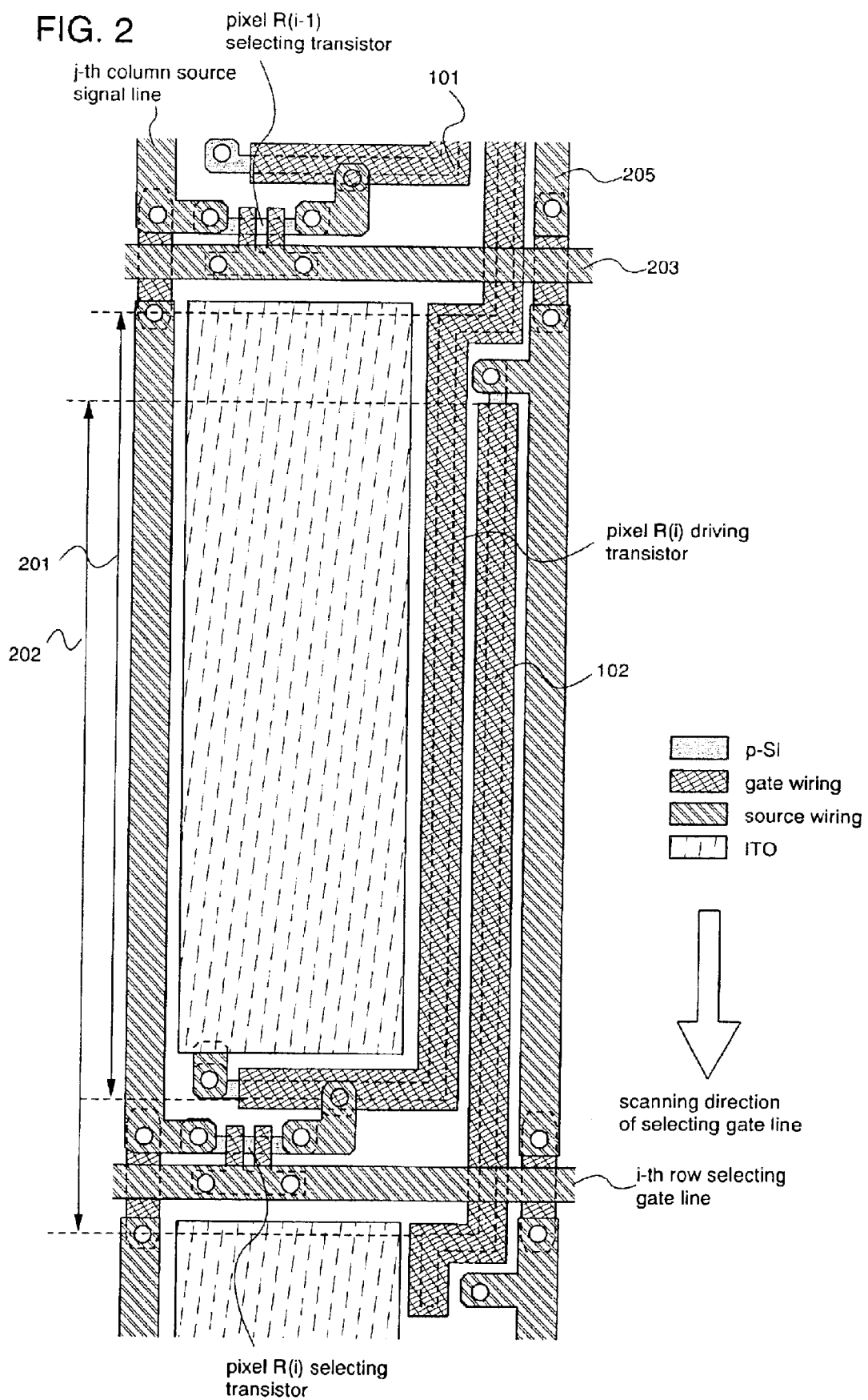
FIG. 2 is a diagram showing layout of circuits of the present invention.
Figure 3:
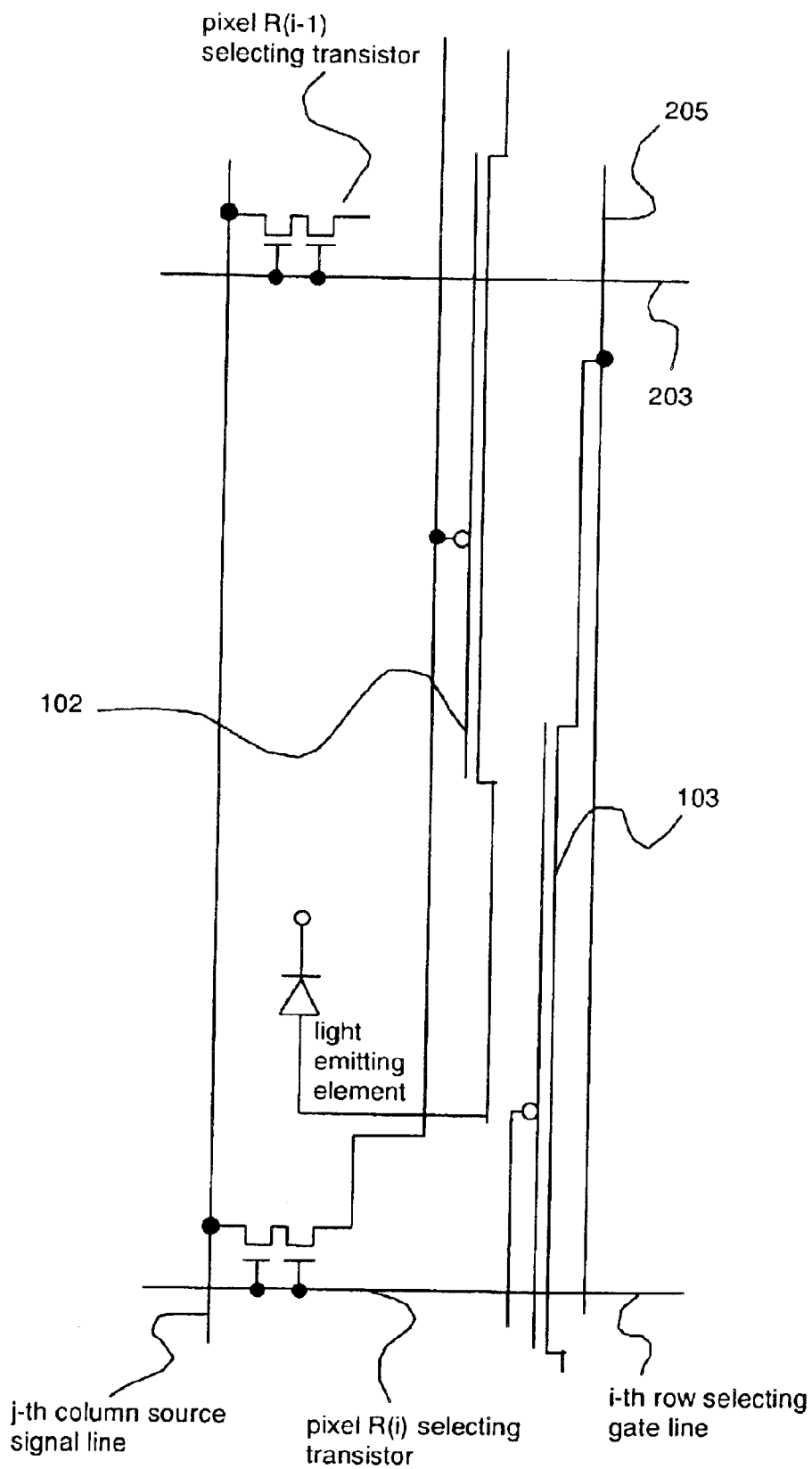
FIG. 3 is a circuit diagram for circuits of the present invention.

FIG. 2 is a layout diagram for the pixel in FIG. 1. The pixel R(i) alone is shown as an example in FIG. 2. A circuit diagram for FIG. 2 is FIG. 3. A sectional view of FIG. 2 is FIG. 4B. FIGS. 2 to 4B use the same symbols for identical components.

Features of the layout diagram shown in FIG. 2 are as follows.

The first feature is that a driving transistor of one pixel is extended to a region of another pixel and therefore the layer of a source wire is used as a selecting gate line. This makes the selecting gate line intersect and overlap the driving transistor. As a result, driving transistor layout is simplified.

For example, in FIG. 2, an (i−1)-th row selecting gate line 203 is arranged to overlap the pixel R(i) driving transistor 102. Accordingly, it is easy to place the driving transistor so as to reach a region of another pixel.

A power supplying line intersects and overlaps a selecting gate line, and the overlapped portion can be formed from the layer of a gate wire. For example, a j-th column power supplying line 205 is arranged to intersect and overlap the (i−1)-th row selecting gate line 203. At the intersection, the j-th column power supplying line 205 is formed of the layer of a gate wire. Thus a power supplying line can overlap a selecting gate line.

Only a portion of a power supplying line that intersects a selecting gate line is formed from the layer of a gate wire. However, as long as a power supplying line is allowed to intersect a selecting gate line, the intersection in the power supplying line can be formed of any wire layer.

Another feature is that a driving transistor is arranged in parallel to a power supplying line and a source signal line. For example, the pixel R(i) driving transistor 102 is in parallel to the power supplying line and the source signal line. Therefore a long transistor can be placed efficiently in each pixel.

By setting the positional relation between a selecting gate line and a power supplying line in this way, a driving transistor can have a length larger than the pixel pitch. To be specific, the length of a channel formation region of a driving transistor can be set larger than the pixel pitch.

The driving transistors shown in FIG. 2 have long channel formation regions: a long channel formation region 201 and a long channel formation region 202. The long channel formation region 201 and the long channel formation region 202 together make the longest channel formation region of a driving transistor. The length of this channel formation region which is the sum of the lengths of two channel formation regions is longer than the pixel pitch, about twice the pixel pitch. Therefore each transistor is irradiated with laser light an increased number of times and fluctuation in characteristic among transistors is reduced.

Lastly, novel points in the layout diagram of FIG. 2 will be described. The features reside in arrangement of driving transistors. In FIG. 2, the pixel R(i) driving transistor 102 is extended to a region of the pixel R(i−1) but not the pixel R (i+1). This is for dealing with noises from the selecting gate line. To elaborate, noises from a selecting gate line, which can enter a driving transistor because the selecting gate line intersects the driving transistor, are reduced by inputting a signal to a pixel after the selecting gate line that intersects the driving transistor is no longer selected.

Given above referring to FIGS. 1 to 4B is a description on an example of placing a transistor in two pixels. However, the present invention is not limited thereto. One transistor may stretch over more than two pixels.

Figure 5:
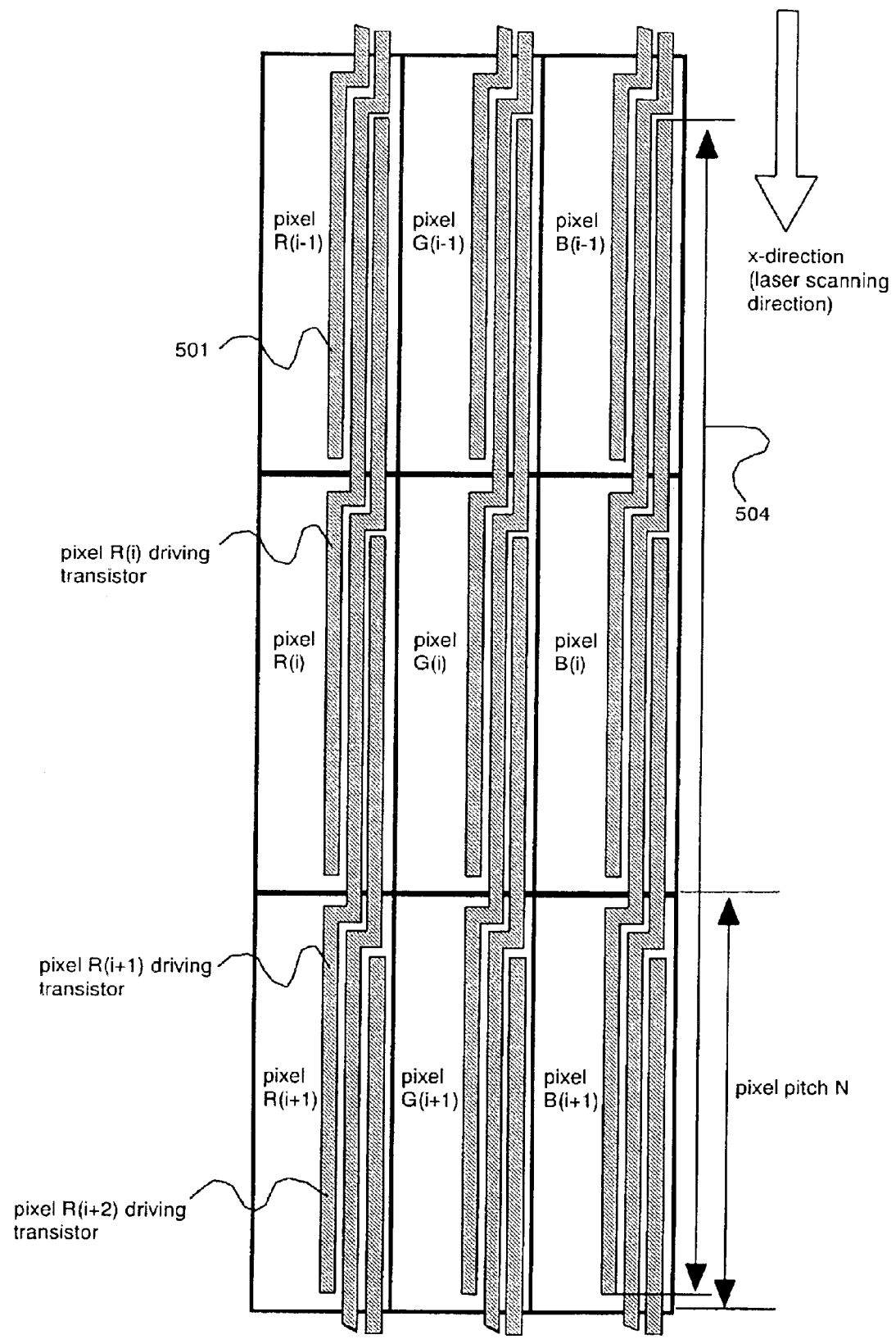
FIG. 5 is a schematic diagram showing arrangement of transistors of the present invention.
Figure 6:
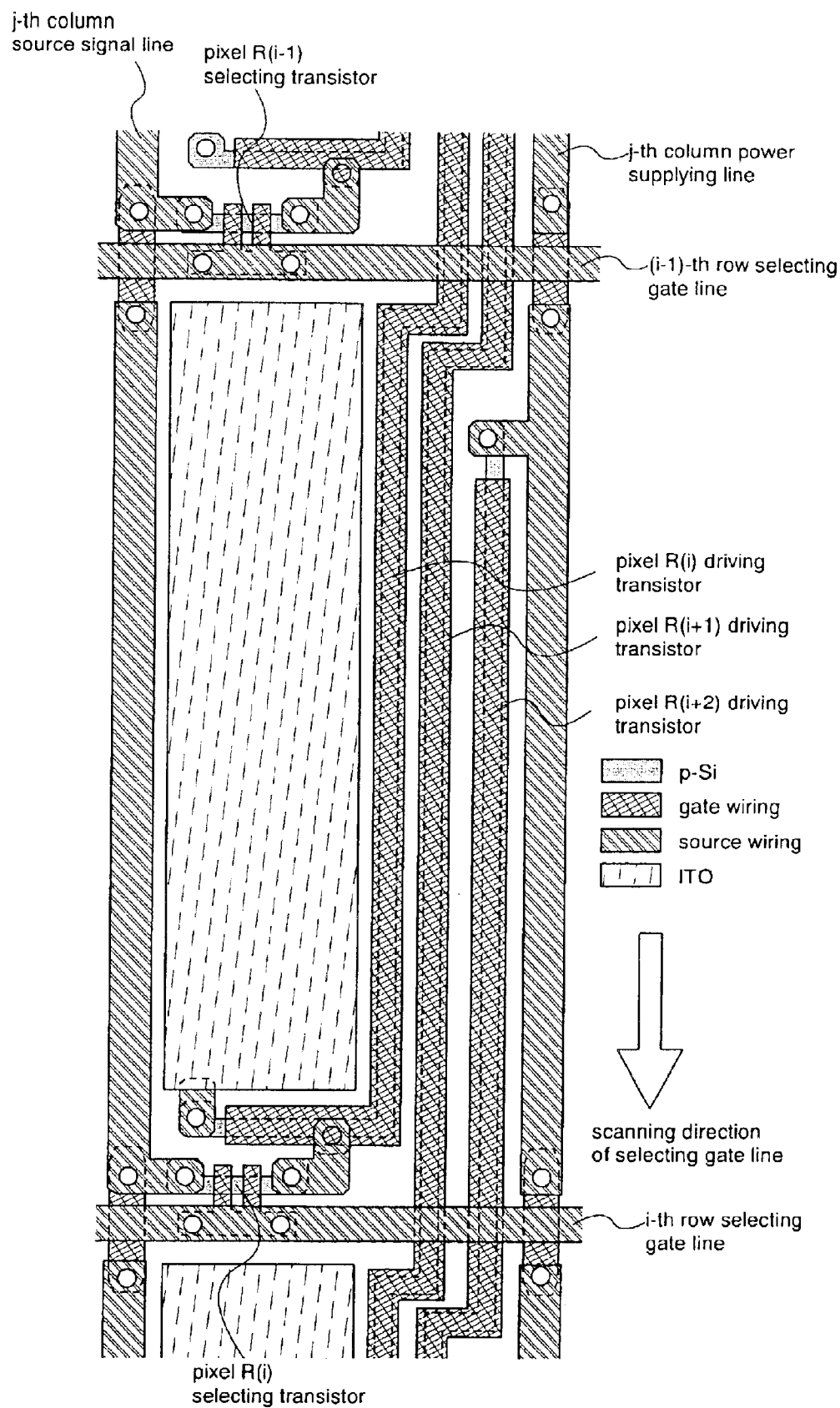
FIG. 6 is a diagram showing layout of circuits of the present invention.

An example of extending a transistor over more than two pixels is described with reference to FIG. 5, where one transistor sits on three pixels. In FIG. 5, a transistor length Z504 is three times the pixel pitch N. FIG. 6 is a layout diagram of the pixels of FIG. 5.

Arrangement of driving transistors shown in FIGS. 5 and 6 makes it possible to design the transistor length arbitrarily. As a result, the number of times a transistor is irradiated with laser light is increased. With the laser light irradiation number increased, fluctuation in crystal state between channel formation regions is reduced.

The description given in this embodiment mode is for a case of displaying a color image. However, the present invention is also applicable to monochrome display.

The description given in this embodiment mode is for a case of the stripe arrangement. However, the present invention is not limited thereto but is applicable to other arrangement such as the delta arrangement.

The description given in this embodiment mode is for a case of constituting a driving transistor from one transistor. However, plural transistors connected in series or parallel may operate as one driving transistor. The present invention is also applicable to a transistor arrangement which is suited to plural transistors working as one driving transistor.

Figure 4A:
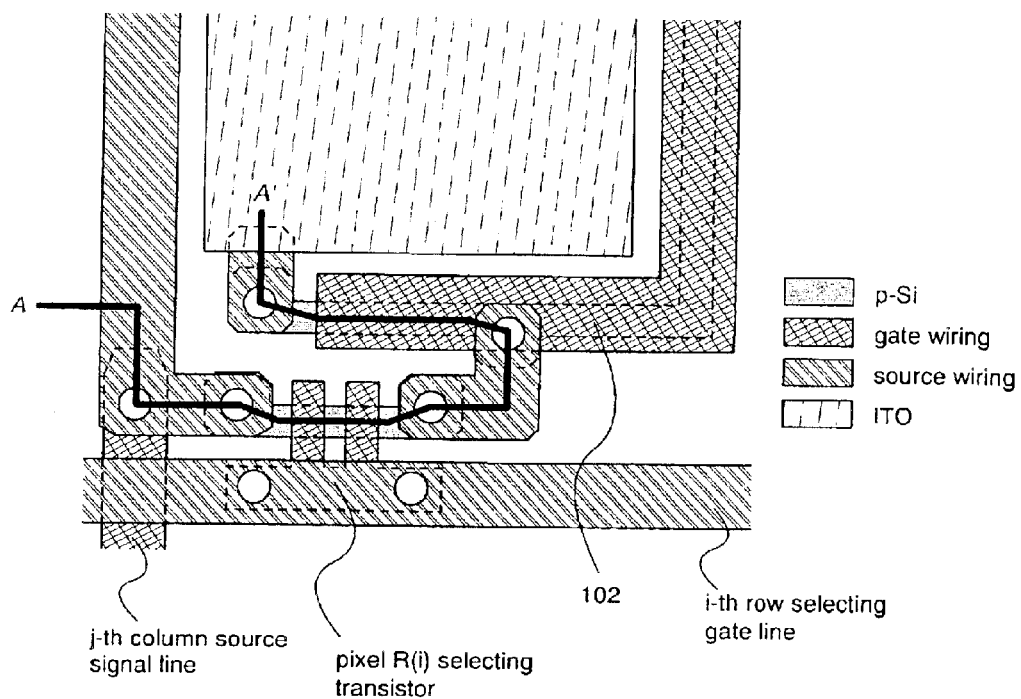
FIGS. 4A and 4B are a top view of circuits of the present invention and a sectional view thereof.
Figure 4B:
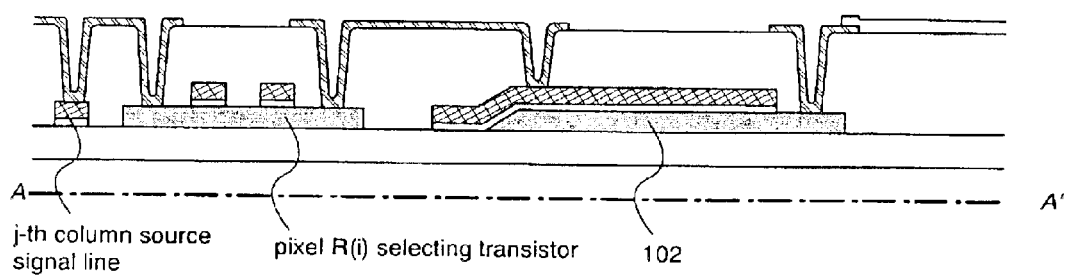
Figure 35A:
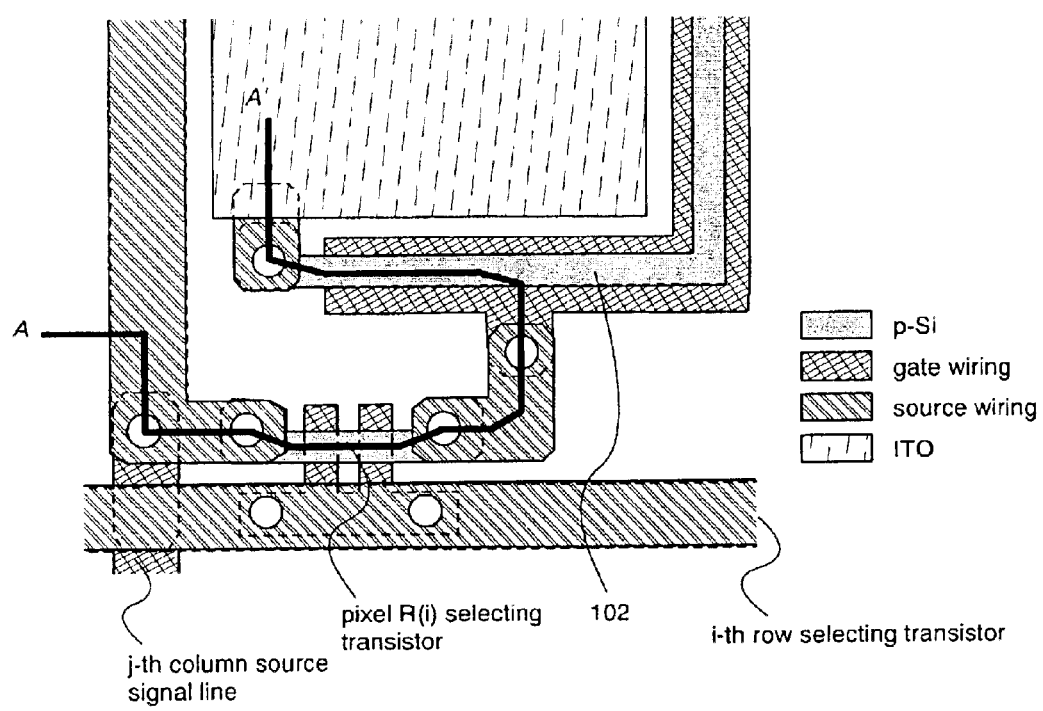
FIGS. 35A and 35B are a top view of circuits of the present invention and a sectional view thereof.
Figure 35B:
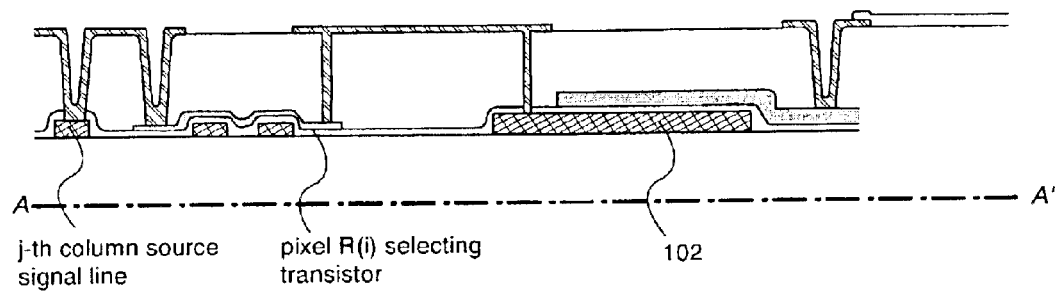

The description given in this embodiment mode uses a transistor in which a gate electrode is formed above a channel formation region as shown in FIGS. 4A and 4B, namely, a top gate transistor. However, the present invention is also applicable to a bottom gate transistor in which a gate electrode is formed below a channel formation region as shown in FIGS. 35A and 35B, and any other transistor structure. This is because the present invention does not depend on the structure of a transistor.

The description given in this embodiment mode is for a pixel circuit structure in which one pixel has two transistors: a selecting transistor and a driving transistor. However, the present invention is also applicable to other circuit structures. Examples thereof include structures shown in FIGS. 33A and 33B and FIGS. 34A and 34B or in JP 2001-343933 A, U.S. Pat. No. 6,229,506 B1, JP 11-219146 A, JP 2001-147659 A, etc. In short, the present invention does not depend on the circuit structure and is applicable to any circuit structure. Among various circuit structures, the present invention is particularly effective to a transistor that influences performance of the device and a transistor that is easily affected by fluctuation.

Other characteristics of the present invention than those described above are given below. A semiconductor device of the present invention has a plurality of transistors arranged to form a matrix pattern, and each transistor has a semiconductor crystallized by laser light irradiation. Each channel formation region of the plural transistors is placed so as to stretch in the first direction. Of the plural transistors, at least two transistors adjacent to each other in the second direction perpendicular to the first direction have a positional relation that makes them staggered in the second direction.

The first direction corresponds to the laser scanning direction. Also, the laser scanning direction corresponds to a direction in which carriers move in a channel formation region of a transistor when a semiconductor is arranged so as to set the channel length long. In an example of carrying out the present invention, a semiconductor is placed on two or three pixels as the one in the pixel R(i−1) driving transistor 101 of FIG. 1 and the one in the pixel R(i−1) transistor 501 of FIG. 5. This way semiconductors occupy only a small area in a pixel despite the channel length of each semiconductor of transistors being larger than the pixel pitch. The semiconductor shape is not limited to those shown in the above; a semiconductor can take any shape as far as the length of the semiconductor is larger than the pixel pitch. The channel length L or channel width W of a channel formation region may be extended, or both may be extended at the same time.

Embodiment Mode 2

Figure 7:
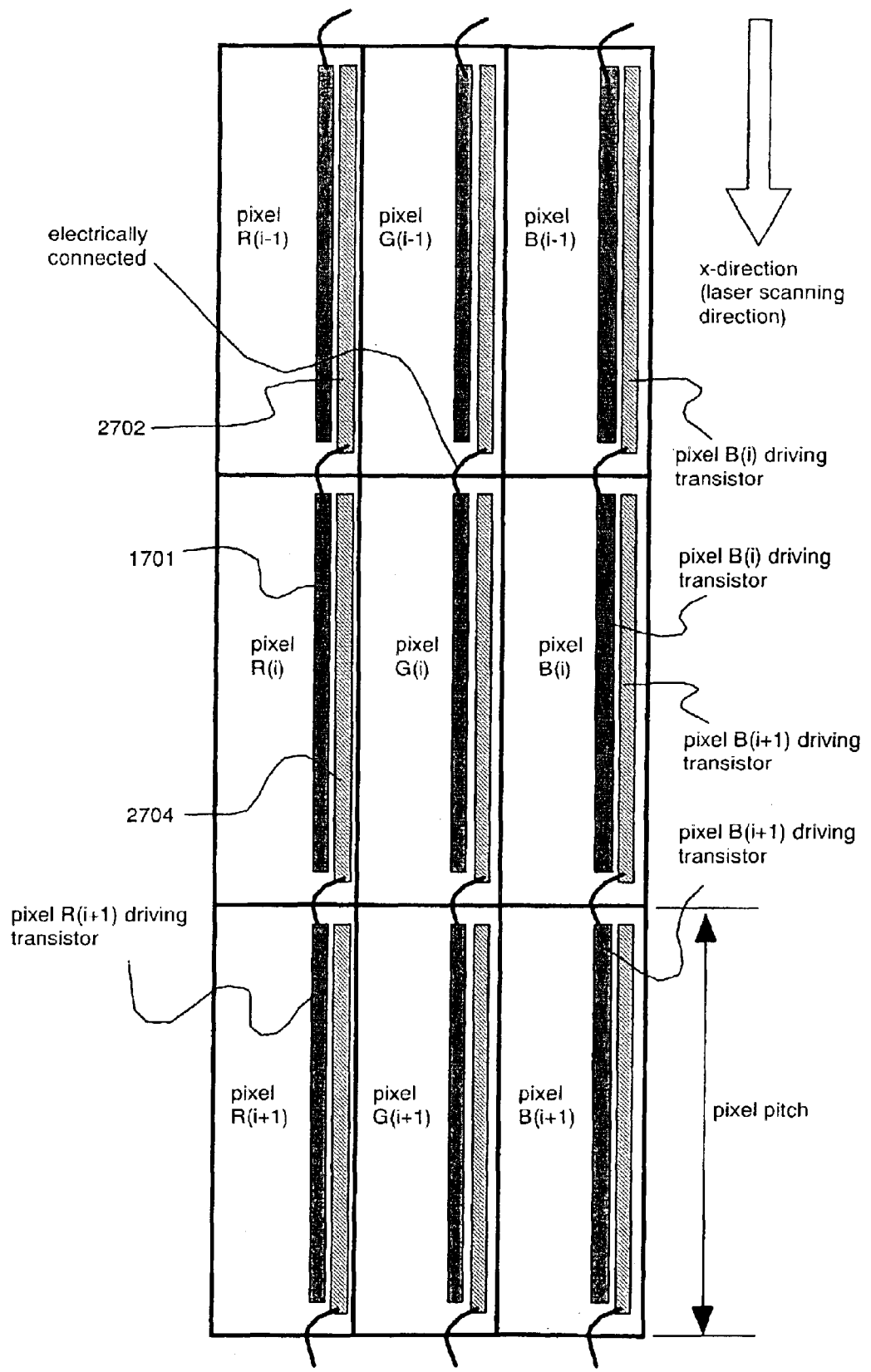
FIG. 7 is a schematic diagram showing arrangement of transistors of the present invention.

This embodiment gives a description with reference to FIGS. 7 to 11 on arrangement of driving transistors which is different from that of Embodiment Mode 1. FIG. 7 is a schematic diagram of arrangement of transistors in pixels.

In FIG. 7, a driving transistor of each pixel is placed so as to reach a region of a surrounding pixel and two transistors are connected in series or parallel to work as one transistor. Therefore a pixel R(i+1) driving transistor 2704 and a pixel R(i) driving transistor 1701 are placed in a pixel R(i). A pixel R(i) driving transistor 2702 is placed in a pixel R(i−1). The pixel R(i) driving transistor 1701 and the pixel R(i) driving transistor 2702 are electrically connected to each other. In this manner, a driving transistor of one pixel is placed in the one pixel and a pixel above in FIG. 7 and the driving transistor in the one pixel and the driving transistor in the above pixel are electrically connected to each other.

The length of a driving transistor therefore corresponds to the sum of the lengths of transistors electrically connected to each other. Accordingly, the length of a driving transistor can be set larger than the pixel pitch. This means that, when a transistor is placed in parallel to the laser scanning direction, each transistor is irradiated with laser light an increased number of times. Therefore fluctuation in crystal state between semiconductors (channel formation region to be exact) is reduced as well as fluctuation in characteristic among transistors.

Here, as shown in FIG. 30, the laser scan pitch is given as M, the pixel pitch as N, and the transistor length as Z. Then a transistor is irradiated with laser light Z/M times. Since Z>N, Z/M is larger than N/M (Z/M>N/M).

The number of times a semiconductor of a transistor is irradiated with laser light is thus increased and therefore fluctuation in transistor itself can be reduced. If the transistor length Z is sufficiently long, the laser scan pitch M can be set slightly larger than that in prior art. This makes it possible to reduce the total laser light irradiation number for irradiating the entire pixel portion. However, in FIG. 1, the transistor length Z starts in one pixel and ends in an adjacent pixel, meaning that the scan pitch M is preferably set twice or less in order to increase the number of times the transistor is irradiated. As a result, processing speed in manufacture of a semiconductor is raised to shorten the manufacture time and manufacture cost is accordingly lowered.

Figure 8:
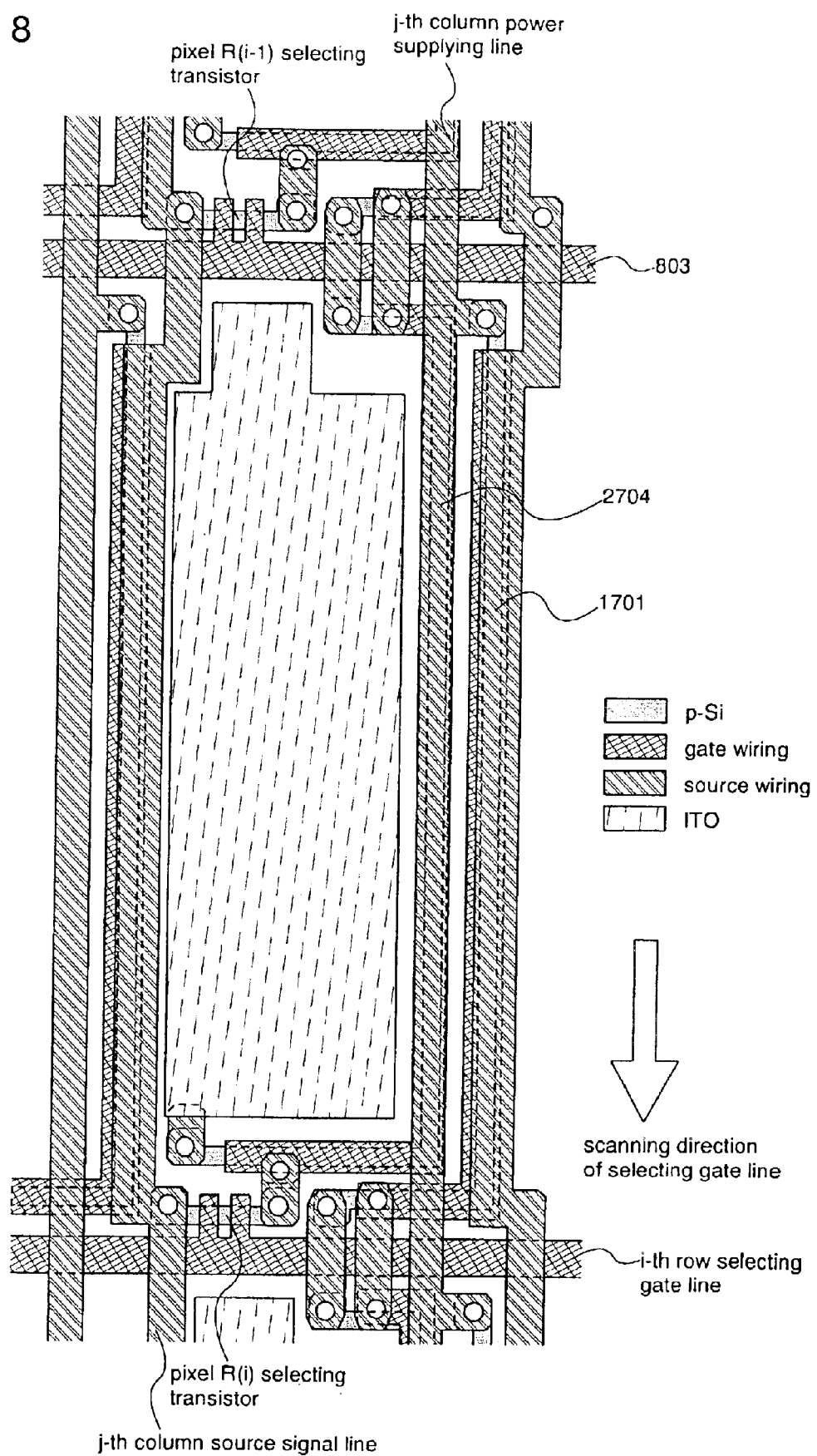
FIG. 8 is a diagram showing layout of circuits of the present invention.
Figure 9:
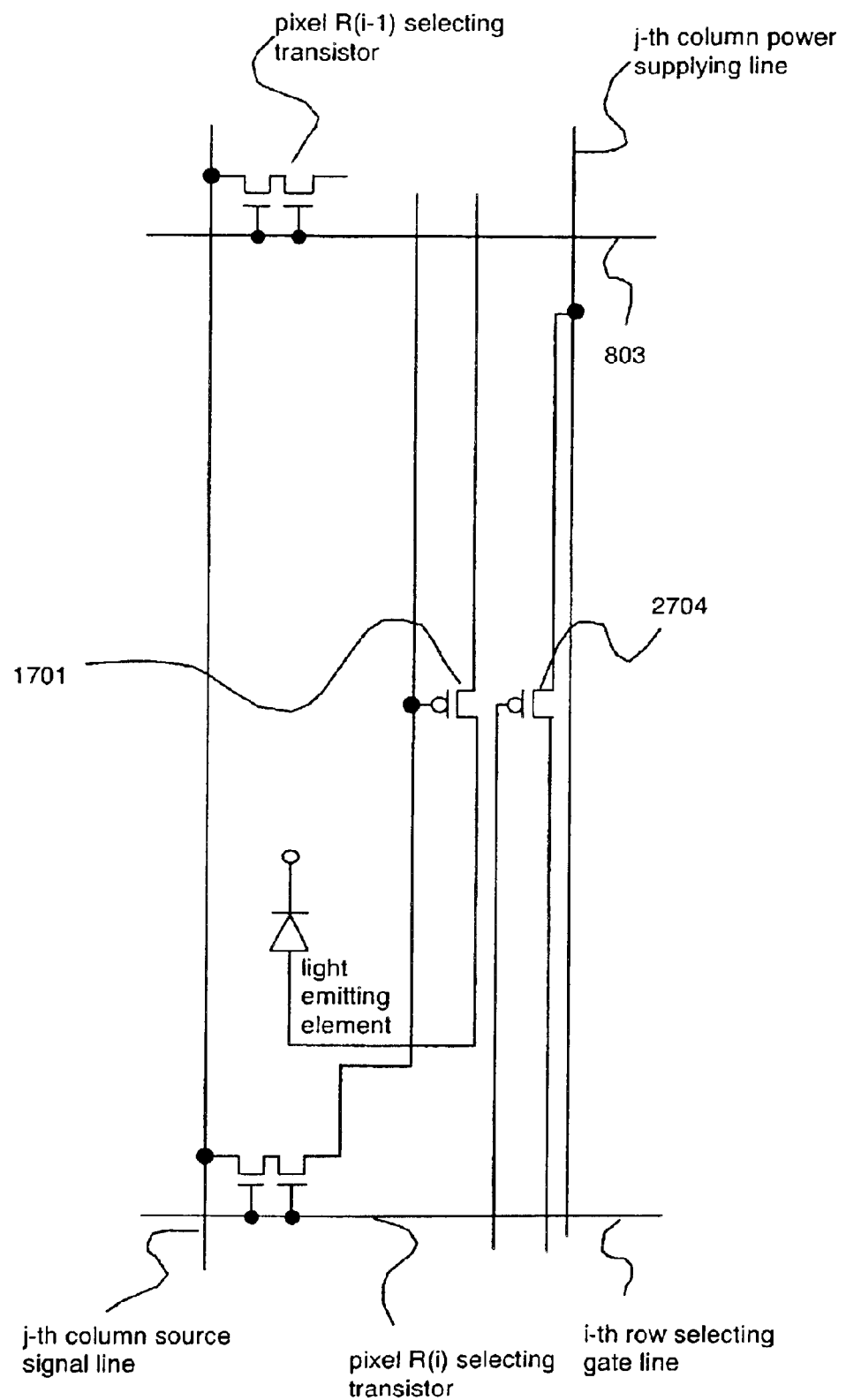
FIG. 9 is a circuit diagram for circuits of the present invention.

FIG. 8 is a layout diagram for the pixel in FIG. 7. The pixel R(i) alone is shown as an example in FIG. 8. A circuit diagram for FIG. 8 is FIG. 9. A sectional view of FIG. 8 is FIG. 10B. FIGS. 7 to 9 use the same symbols for identical components.

Features of FIG. 8 are as follows.

The first feature is arrangement of wires that makes a selecting gate line intersect a driving transistor extending over plural pixels for electrical connection with the driving transistor. For example, the pixel R(i) driving transistor 1701 climbs over an (i−1)-th row selecting gate line 803 to be electrically connected with the pixel R(i−1) driving transistor. Since a transistor intersects and climbs over a selecting gate line that is formed of the layer of a gate wire, a portion of the wire where it is climbed over is formed of the layer of a source wire. This gives a transistor a long channel formation region.

Another feature is that a driving transistor is arranged in parallel to a power supplying line and a source signal line. For example, the pixel R(i) driving transistor 1701 is in parallel to the power supplying line and the source signal line.

Therefore a transistor having a long channel formation region can be placed efficiently.

By connecting driving transistors in this way, a channel formation region of a driving transistor can have a length larger than the pixel pitch. The channel formation length here is the sum of channel formation regions of two transistors since two transistors are connected in series in this example.

Described above is an example of placing each transistor in two pixels and connecting one transistor to another. However, the present invention is not limited thereto. Each transistor may be extended over more than two pixels.

Figure 11:
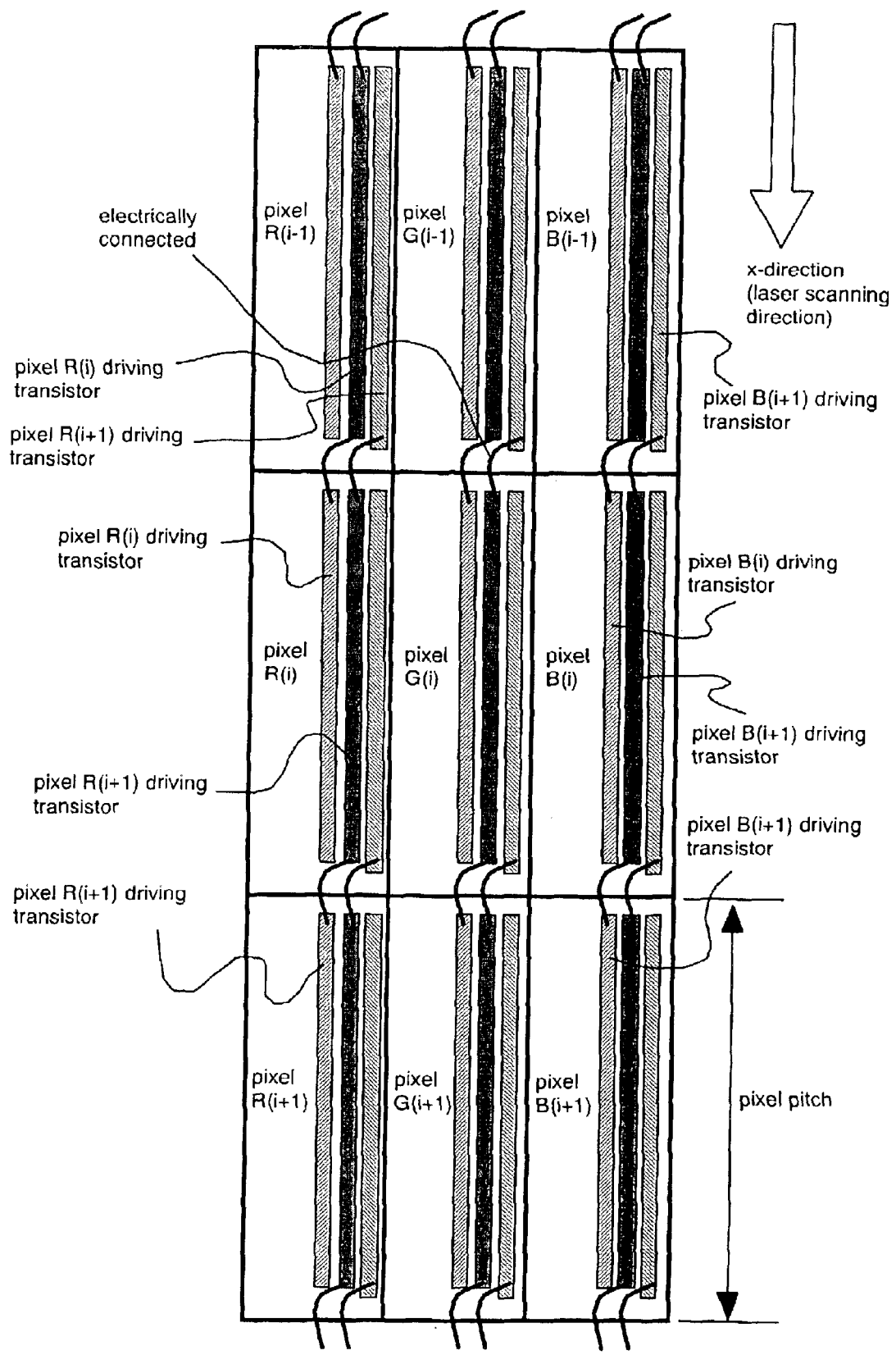
FIG. 11 is a schematic diagram showing arrangement of transistors of the present invention.

An example of placing a transistor in more than two pixels is shown in FIG. 11, where each transistor is extended over three pixels and one transistor is connected to another.

Arrangement of transistors shown in FIG. 11 makes it possible to design the transistor length arbitrarily. As a result, the number of times a transistor is irradiated with laser light is increased. With the laser light irradiation number increased, fluctuation in crystal state between channel formation regions of transistors is reduced and therefore fluctuation in characteristic among transistors can be lowered.

The description given in this embodiment mode is for a case of displaying a color image. However, the present invention is also applicable to monochrome display.

The description given in this embodiment mode is for a case of the stripe arrangement. However, the present invention is not limited thereto but is applicable to other arrangement such as the delta arrangement.

The description given in this embodiment mode is for a case of constituting a driving transistor from one transistor. However, plural transistors connected in series or parallel may operate as one driving transistor. The present invention is also applicable to a transistor arrangement which is suited to plural transistors working as one driving transistor.

The description given in this embodiment mode uses a transistor in which a gate electrode is formed above a channel formation region as shown in FIGS. 10A and 10B, namely, a top gate transistor. However, the present invention is also applicable to a bottom gate transistor in which a gate electrode is formed below a channel formation region as shown in FIGS. 35A and 35B, and any other transistor structure. This is because the present invention does not depend on the structure of a transistor.

The description given in this embodiment mode is for a pixel circuit structure in which one pixel has two transistors: a selecting transistor and a driving transistor. However, the present invention is also applicable to other circuit structures. Examples thereof include structures shown in FIGS. 33A and 33B and FIGS. 34A and 34B or in JP 2001-343933 A, U.S. Pat. No. 6,229,506 B1, JP 11-219146 A, JP 2001-147659 A, etc. In short, the present invention does not depend on the circuit structure and is applicable to any circuit structure. Among various circuit structures, the present invention is particularly effective to a transistor that influences performance of the device and a transistor that is easily affected by fluctuation.

Other characteristics of the present invention than those described above are given below. A semiconductor device of the present invention has a plurality of transistors arranged to form a matrix pattern, and each transistor has a semiconductor crystallized by laser light irradiation. When the semiconductor is irradiated with laser light, a laser may be moved or the substrate itself may be moved. Each channel formation region of the plural transistors is placed so as to stretch in the laser light scanning direction. Of the plural transistors, at least two transistors adjacent to each other in the direction perpendicular to the laser scanning direction have a positional relation that makes them staggered in the laser light scanning direction.

Each semiconductor of the plural transistors has a shape obtained by combining two shapes: a shape axisymmetric to capital letter L and a shape axisymmetric to half-turned capital letter L, and is extended over two or three pixels. This way semiconductors occupy only a small area in a pixel despite the channel length of each semiconductor of transistors being larger than the pixel pitch.

Embodiment Mode 3

Figure 12:
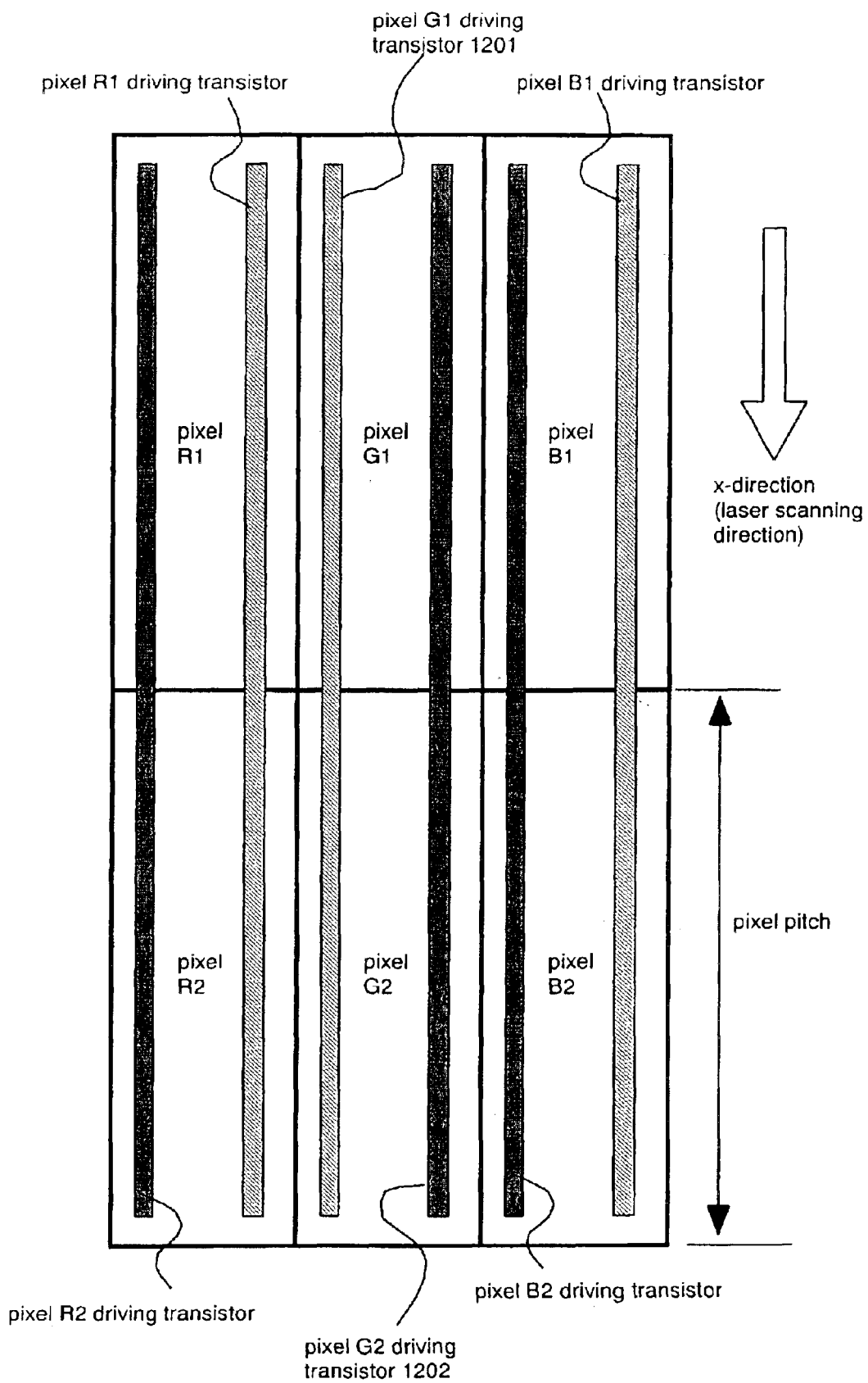
FIG. 12 is a schematic diagram showing arrangement of transistors of the present invention.

The above embodiment modes describe novel arrangement for transistors. In this embodiment mode, novel arrangement for selecting gate lines will be described with reference to FIGS. 12 to 15B. FIG. 12 is a schematic diagram of arrangement of transistors in pixels. FIG. 12 shows two pixels arranged in accordance with the stripe arrangement. However, the number of pixels in FIG. 12 will be six if one pixel is to have one color. For discrimination, the R color portion of the first pixel from the top of FIG. 12 is referred to as pixel R1, the G color portion thereof is pixel G1, and the B color portion thereof is pixel B1. Similarly, the R color portion of the second pixel from the top is referred to as pixel R2, the G color portion thereof is G2, and the B color portion thereof is pixel B2.

Each pixel has transistors. For instance, the pixel G1 has a transistor for driving a light emitting element of the pixel. This transistor is called a pixel G1 driving transistor 1201. Similarly, the pixel G2 has a pixel G2 driving transistor 1202. The same applies to the rest of the pixels.

In the layout diagram of FIG. 12, the pixels are arranged as if two pixels form a pair. The driving transistor of the upper pixel extends to a region of the lower pixel whereas the driving transistor of the lower pixel extends to a region of the upper pixel. To be specific, the pixel G1 driving transistor 1201 extends to a region of the pixel G2 whereas the pixel G2 driving transistor 1202 extends to a region of the pixel G1.

The length of a driving transistor can therefore be set larger than the pixel pitch. Thus, the laser scanning direction and a direction in which the channel formation region of a transistor stretches can be made parallel to each other, whereby the number of times each driving transistor is irradiated with laser light is increased. Therefore fluctuation in characteristic among transistors is reduced.

Here, as shown in FIG. 30, the laser scan pitch is given as M, the pixel pitch as N, and the transistor length as Z. Then a transistor is irradiated with laser light Z/M times. Since Z>N, Z/M is larger than N/M (Z/M>N/M).

According to the present invention, the number of times a transistor is irradiated with laser light is thus increased and therefore fluctuation in transistor itself can be reduced. Further, if the transistor length Z is sufficiently long, the laser scan pitch M can be set slightly larger than that in prior art. This makes it possible to reduce the laser light irradiation number for irradiating the entire pixel portion. However, in FIG. 1, the transistor length Z starts in one pixel and ends in an adjacent pixel, meaning that the scan pitch M is preferably set twice or less in order to increase the number of times the transistor is irradiated. As a result, processing speed in manufacture of a semiconductor device is raised and manufacture cost is accordingly lowered.

Figure 13:
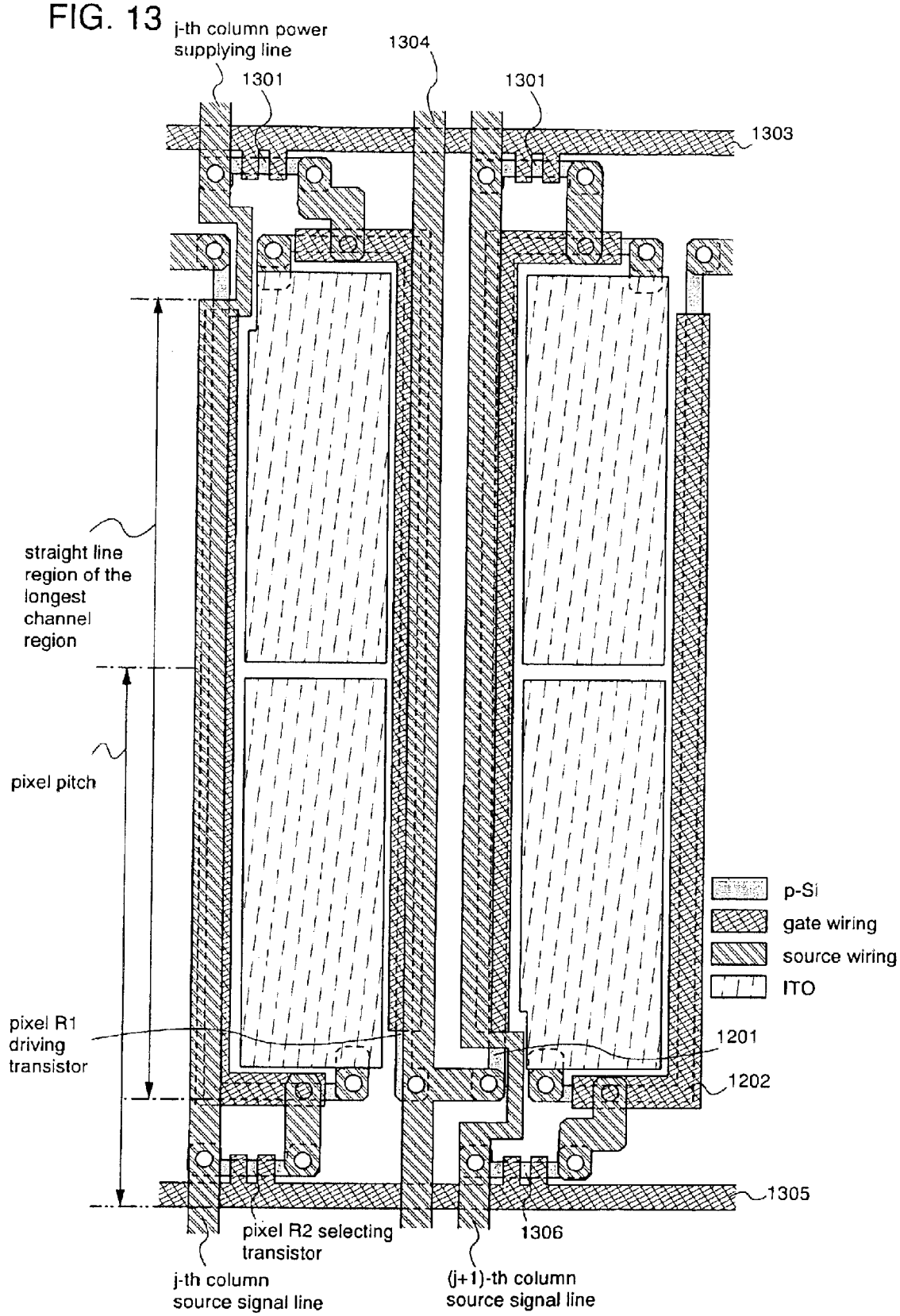
FIG. 13 is a diagram showing layout of circuits of the present invention.
Figure 14:
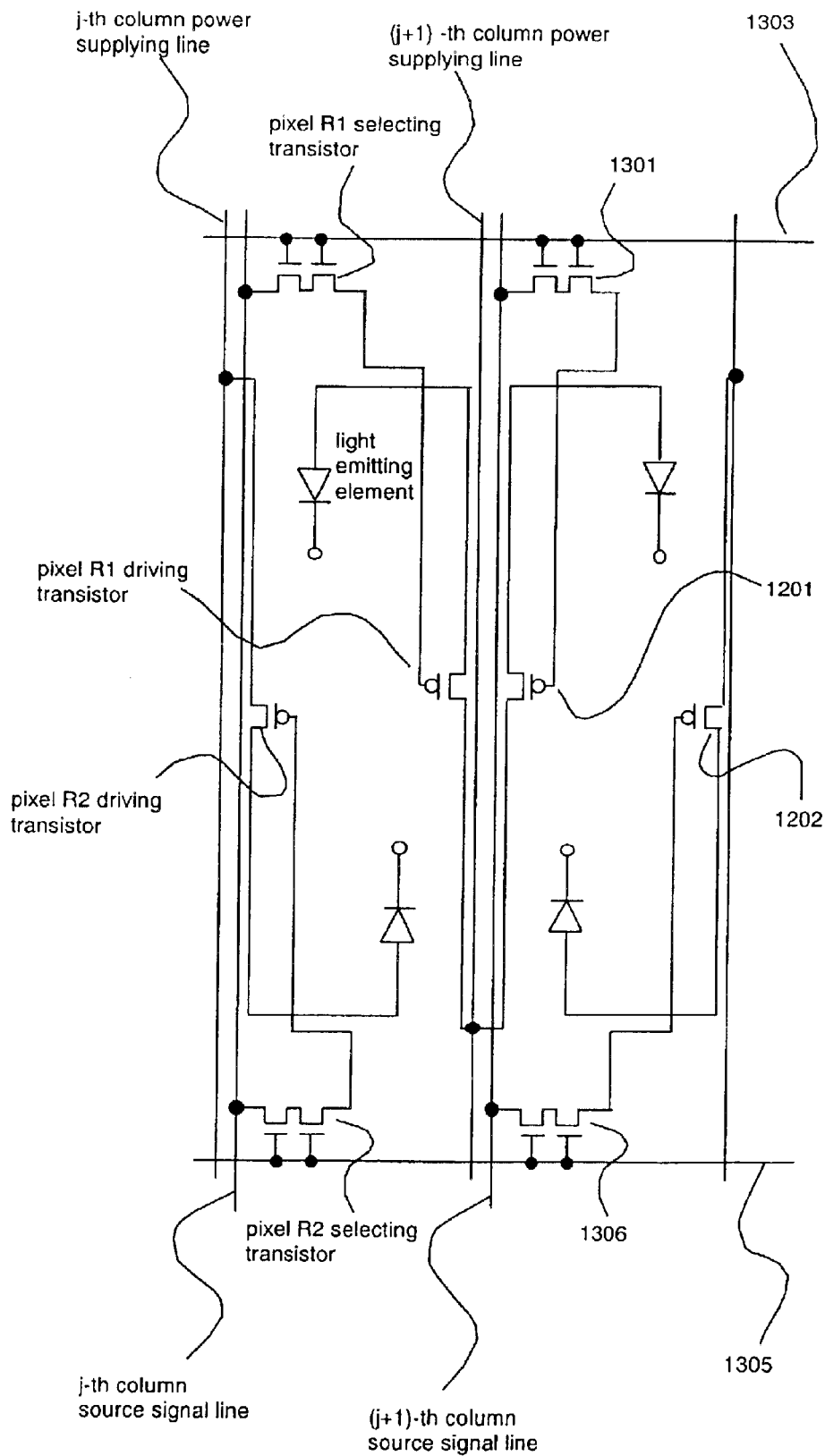
FIG. 14 is a circuit diagram for circuits of the present invention.

FIG. 13 is a layout diagram for the pixel in FIG. 12. The pixels R1, R2, G1, and G2 are shown as an example in FIG. 13. A circuit diagram for FIG. 13 is FIG. 14. A sectional view of FIG. 13 is FIG. 15B. FIGS. 13 to 15B use the same symbols for identical components.

Features of the Layout Diagram FIG. 13 are as follows.

The first feature is that, in upper pixels such as the pixel R1 and the pixel G1, a selecting gate line and a selecting transistor are placed on the upper side. For example, an i-th row selecting gate line 1303 and a pixel G1 selecting transistor 1301 are placed on the upper side of the pixel. On the other hand, in lower pixels such as the pixel R2 and the pixel G2, a selecting gate line and a selecting transistor are placed on the lower side. For instance, an (i+1)-th row selecting gate line 1305 and a pixel G2 selecting transistor 1306 are placed on the lower side of the pixel.

This makes it possible to place a driving transistor of one pixel in another pixel as it is. Specifically, the pixel G1 driving transistor 1201 can reach a region of the pixel G2 as it is and the pixel G2 driving transistor 1202 can reach a region of the pixel G1 as it is.

Accordingly, in which part of a pixel region a selecting gate line and a selecting transistor are placed varies from one row to another. Also, the position of a driving transistor in a pixel region is varied from one row to another. Furthermore, the position of an ITO film in a pixel region differs from one row to another. An ITO film forms an anode electrode of a light emitting element and therefore an ITO film region (a region inside the ITO film region, to be exact) serves as a light emitting region. Accordingly, the position of a light emitting region in a pixel region also differs from one row to another.

Another feature is that a driving transistor, for example, the pixel G1 driving transistor 1201 is arranged in parallel to the power supplying line and the source signal line. Therefore a long transistor can be placed efficiently.

By arranging selecting gate lines in this way, a channel formation region of a driving transistor can have a length larger than the pixel pitch.

The description given in this embodiment mode is for a case of displaying a color image. However, the present invention is also applicable to monochrome display.

The description given in this embodiment mode is for a case of the stripe arrangement. However, the present invention is not limited thereto but is applicable to other arrangement such as the delta arrangement.

The description given in this embodiment mode is for a case of constituting a driving transistor from one transistor. However, plural transistors connected in series or parallel may operate as one driving transistor. The present invention is also applicable to a transistor arrangement which is suited to plural transistors working as one driving transistor.

Figure 15A:
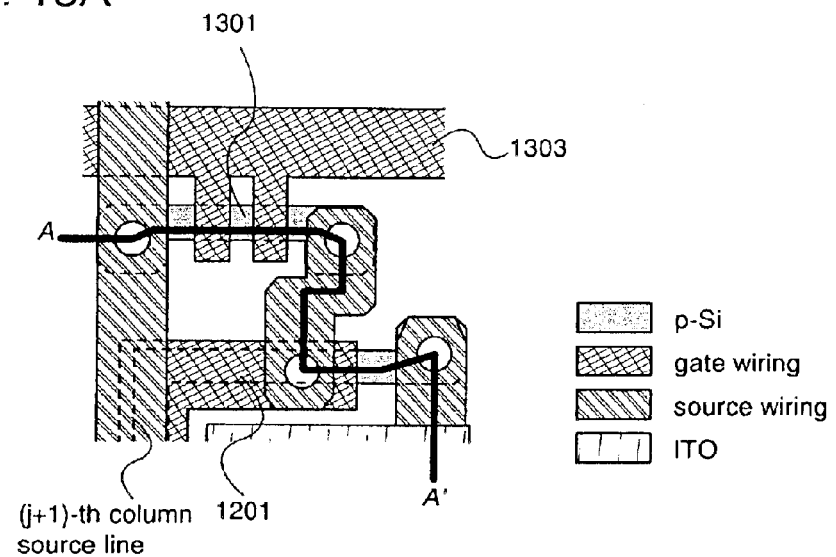
FIGS. 15A and 15B are a top view of circuits of the present invention and a sectional view thereof.
Figure 15B:
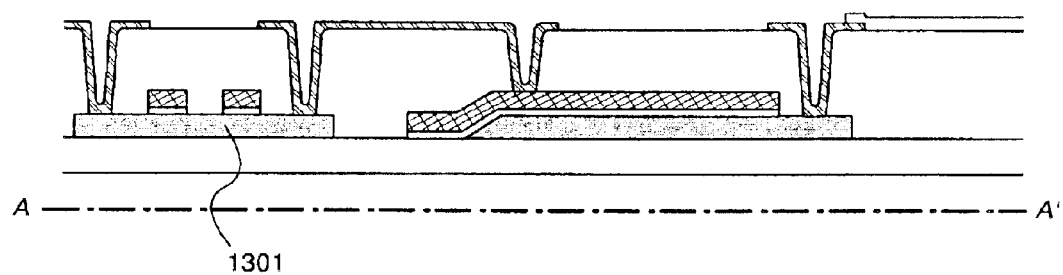

The description given in this embodiment mode uses a transistor in which a gate electrode is formed above a channel formation region as shown in FIGS. 15A and 15B, namely, a top gate transistor. However, the present invention is also applicable to a bottom gate transistor in which a gate electrode is formed below a channel formation region as shown in FIGS. 35A and 35B, and any other transistor structure. This is because the present invention does not depend on the structure of a transistor.

The description given in this embodiment mode is for a pixel circuit structure in which one pixel has two transistors: a selecting transistor and a driving transistor. However, the present invention is also applicable to other circuit structures. Examples thereof include structures shown in FIGS. 33A and 33B and FIGS. 34A and 34B or in JP 2001-343933 A, U.S. Pat. No. 6,229,506 B1, JP 11-219146 A, JP 2001-147659 A, etc. In short, the present invention does not depend on the circuit structure and is applicable to any circuit structure. Among various circuit structures, the present invention is particularly effective to a transistor that influences performance of the device and a transistor that is easily affected by fluctuation.

Embodiment Mode 4

Figure 16:
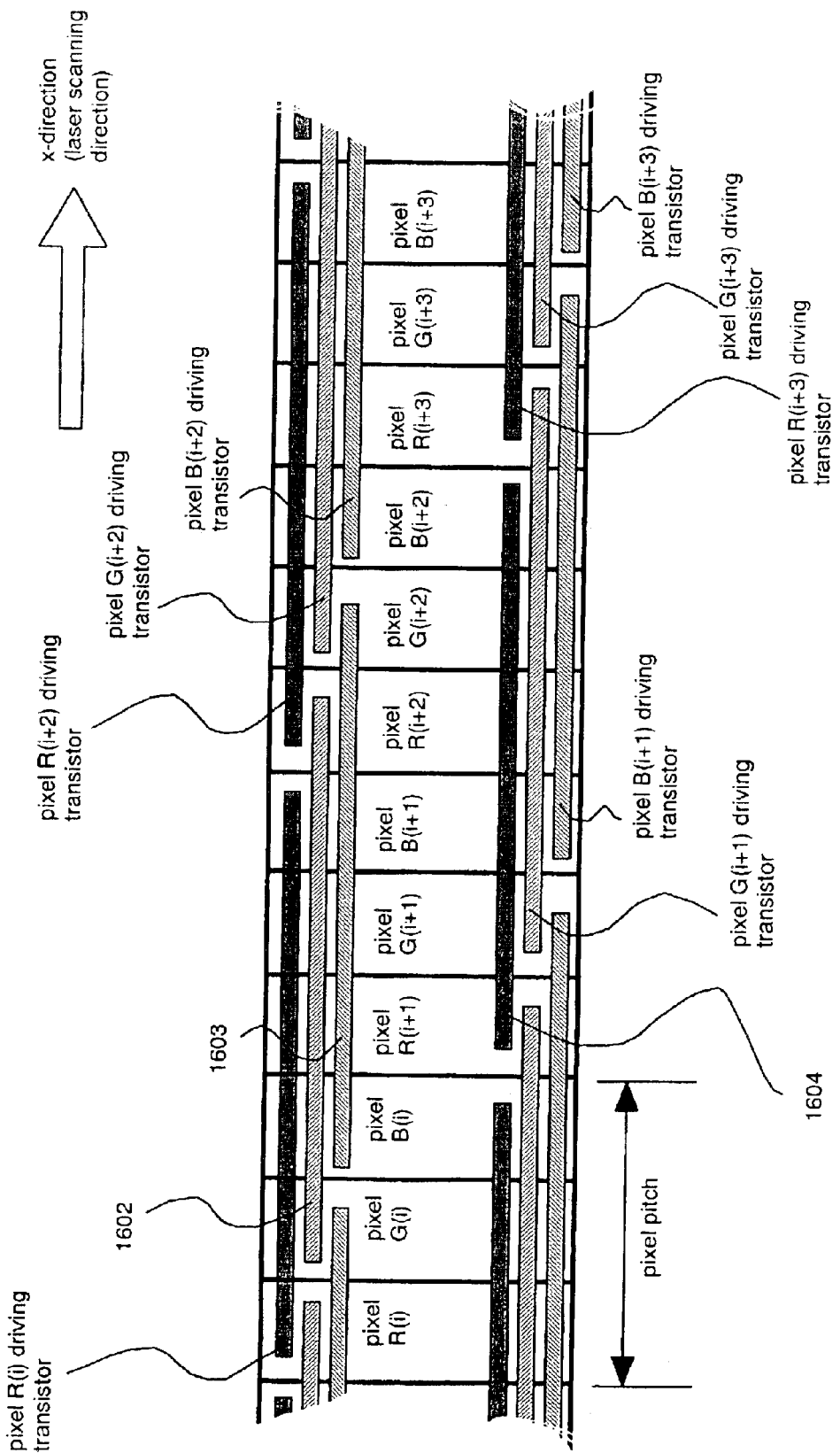
FIG. 16 is a schematic diagram showing arrangement of transistors of the present invention.

In this embodiment mode, a case where driving transistors are arranged in a width direction will be described with reference to FIGS. 16 to 18. FIG. 16 is a schematic diagram of arrangement of transistors in pixels. FIG. 16 shows four pixels arranged in accordance with the stripe arrangement. However, the number of pixels in FIG. 16 will be twelve if one pixel is to have one color. For discrimination, the R color portion of the first pixel from left of FIG. 16 is referred to as pixel R(i), the G color portion thereof is pixel G(i), and the B color portion thereof is pixel B(i). Similarly, the R color portion of the second pixel from left is referred to as pixel R(i+1), the G color portion thereof is G(i+1), and the B color portion thereof is pixel B(i+1). The R color portion of the third pixel from left is referred to as pixel R(i+2), the G color portion thereof is G(i+2), and the B color portion thereof is pixel B(i+2). The R color portion of the fourth pixel from left is referred to as pixel R(i+3), the G color portion thereof is G(i+3), and the B color portion thereof is pixel B(i+3).

Each pixel has transistors. For instance, the pixel R(i+1) has a transistor for driving a light emitting element of the pixel. This transistor is called a pixel R(i+1) driving transistor 1604. The same applies to the rest of the pixels.

In this embodiment mode, a driving transistor of each pixel is extended in a lateral direction and arranged so as to stretch over a region of an adjacent pixel as shown in FIG. 16. To be specific, the pixel R(i+1) driving transistor 1604 is extended to a region of the pixels G(i+1), B(i+1), R(i+2), G(i+2), and B(i+2). Thus a driving transistor of one pixel is arranged over a region of an adjacent pixel.

The length of a driving transistor can therefore be set larger than the pixel pitch. Thus, the laser scanning direction and a direction in which a transistor extends can be made parallel to each other, whereby the number of times each driving transistor is irradiated with laser light is increased. Therefore fluctuation in characteristic among transistors is reduced.

Here, as shown in FIG. 30, the laser scan pitch is given as M, the pixel pitch as N, and the transistor length as Z. Then a transistor is irradiated with laser light Z/M times. Since Z>N, Z/M is larger than N/M (Z/M>N/M).

According to the present invention, the number of times a transistor is irradiated with laser light is thus increased and therefore fluctuation in transistor itself can be reduced. Further, if the transistor length Z is sufficiently long, the laser scan pitch M can be set slightly larger than that in prior art. This makes it possible to reduce the laser light irradiation number for irradiating the entire pixel portion. However, in FIG. 1, the transistor length Z starts in one pixel and ends in an adjacent pixel, meaning that the scan pitch M is preferably set twice or less in order to increase the number of times the transistor is irradiated. As a result, processing speed in manufacture of a semiconductor device is raised and manufacture cost is accordingly lowered.

Figure 17:
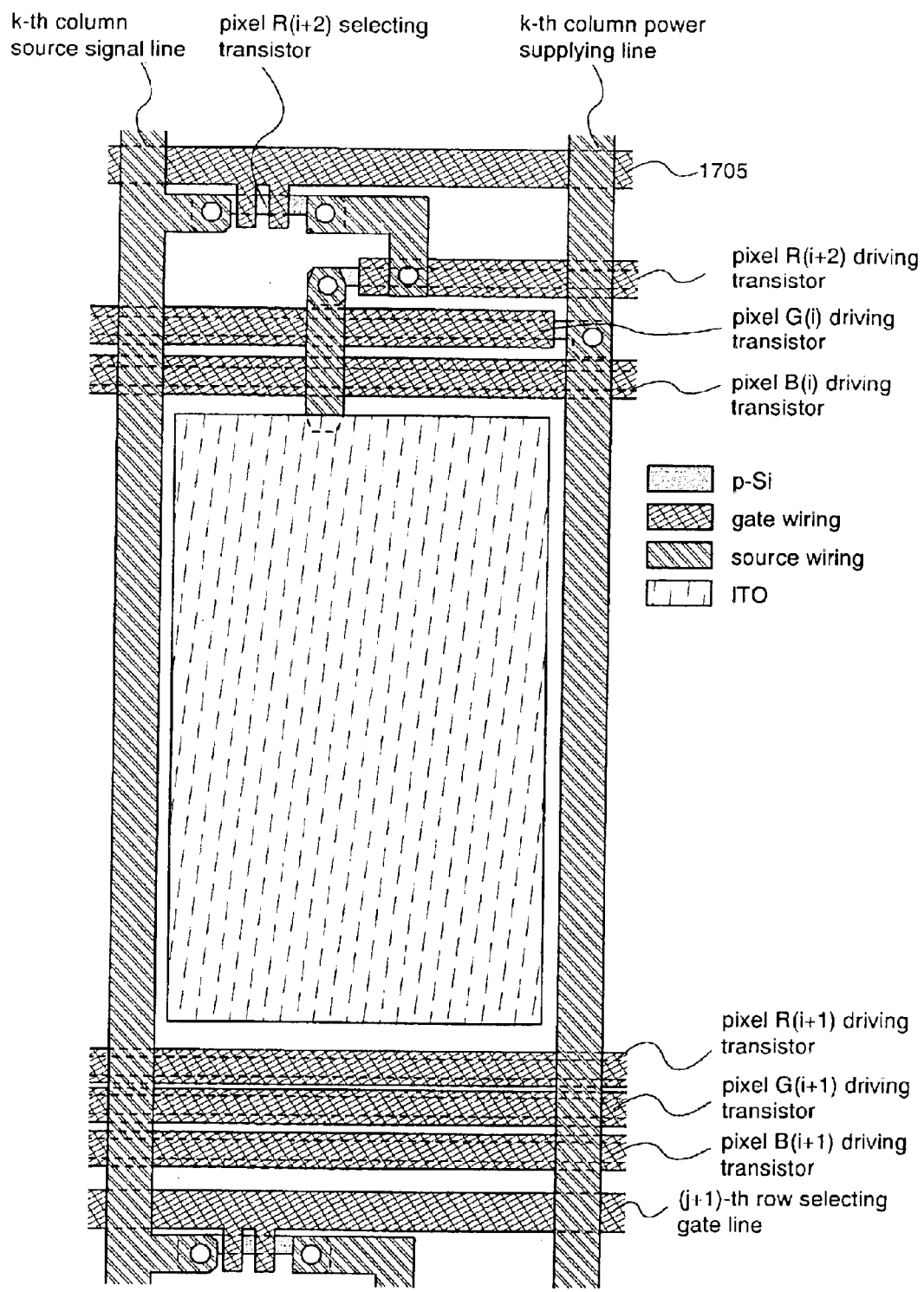
FIG. 17 is a diagram showing layout of circuits of the present invention.
Figure 18:
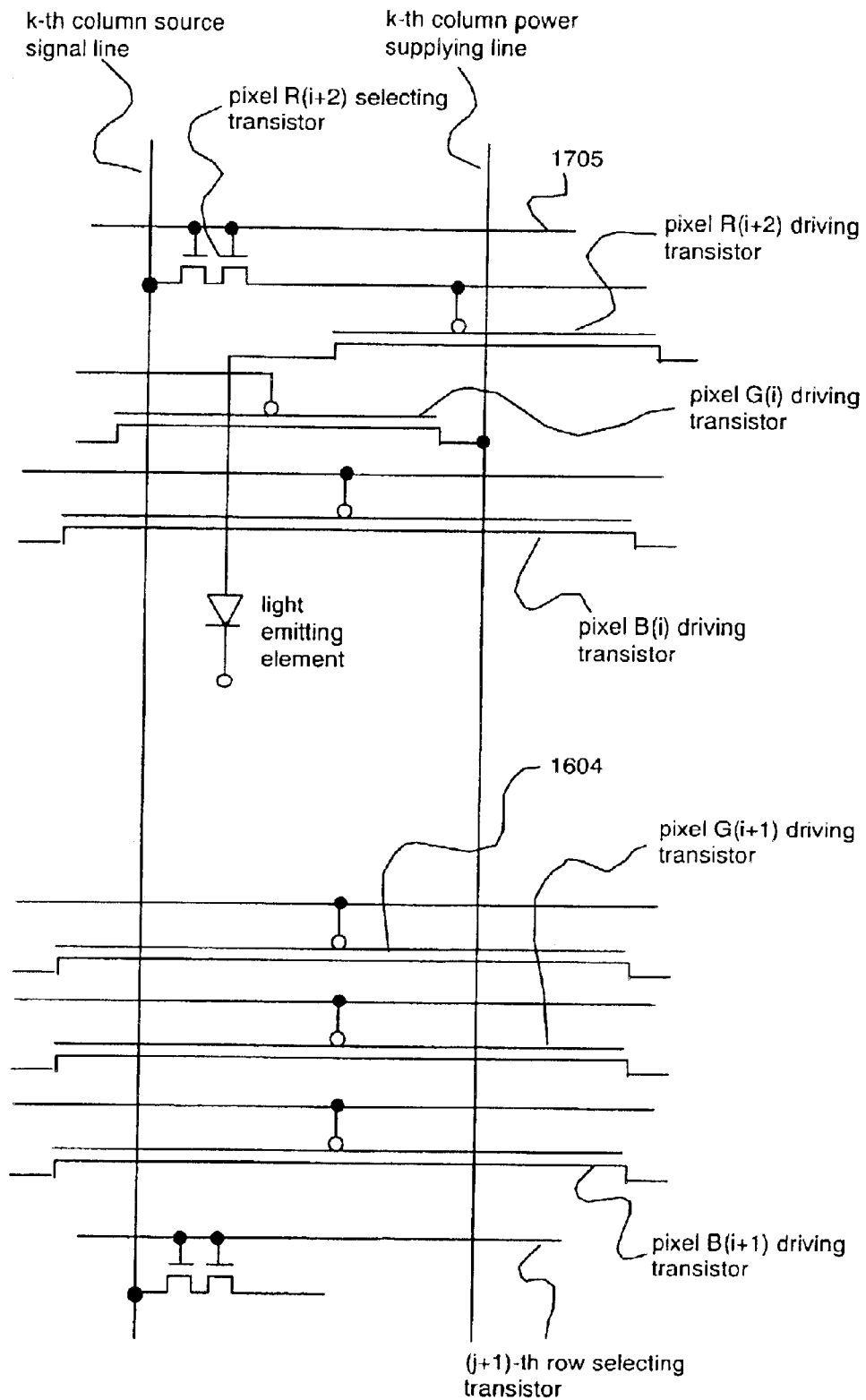
FIG. 18 is a circuit diagram for circuits of the present invention.

FIG. 17 is a layout diagram for the pixel in FIG. 16. The pixel R(i+2) alone is shown as an example in FIG. 17. When layout similar to this layout is repeated, layout showing the whole pixel portion is completed. A circuit diagram for FIG. 17 is FIG. 18. There are used same symbols for identical components.

Features of FIG. 17 are as follows.

The first feature is that a driving transistor is arranged in parallel to a selecting gate line. For example, each driving transistor is placed in parallel to a j-th row selecting gate line

1705. This makes it easy to set the length of a driving transistor long.

By connecting driving transistors in this way, a driving transistor, or in a more accurate term, a channel formation region of a driving transistor can have a length larger than the pixel pitch.

Described above is an example of placing each transistor in two pixels. However, the present invention is not limited thereto. Each transistor may be extended over more than two pixels.

Such arrangement of transistors makes it possible to design the transistor length arbitrarily. As a result, it becomes possible to increase the number of times of laser light irradiation. With the laser light irradiation number increased, fluctuation in crystal state between channel formation regions of transistors is reduced and therefore fluctuation in characteristic among transistors can be lowered.

The description given in this embodiment mode is for a case of displaying a color image. However, the present invention is also applicable to monochrome display.

The description given in this embodiment mode is for a case of the stripe arrangement. However, the present invention is not limited thereto but is applicable to other arrangement such as the delta arrangement.

The description given in this embodiment mode is for a case of constituting a driving transistor from one transistor. However, plural transistors connected in series or parallel may operate as one driving transistor. The present invention is also applicable to a transistor arrangement which is suited to plural transistors working as one driving transistor.

The description given in this embodiment mode uses a transistor in which a gate electrode is formed above a channel formation region as shown in FIGS. 4A and 4B, namely, a top gate transistor. However, the present invention is also applicable to a bottom gate transistor in which a gate electrode is formed below a channel formation region as shown in FIGS. 35A and 35B, and any other transistor structure. This is because the present invention does not depend on the structure of a transistor.

The description given in this embodiment mode is for a pixel circuit structure in which one pixel has two transistors: a selecting transistor and a driving transistor. However, the present invention is also applicable to other circuit structures. Examples thereof include structures shown in FIGS. 33A and 33B and FIGS. 34A and 34B or in JP 2001-343933 A, U.S. Pat. No. 6,229,506 B1, JP 11-219146 A, JP 2001-147659 A, etc. In short, the present invention does not depend on the circuit structure and is applicable to any circuit structure. Among various circuit structures, the present invention is particularly effective to a transistor that influences performance of the device and a transistor that is easily affected by fluctuation.

Embodiment Mode 5

Figure 19:
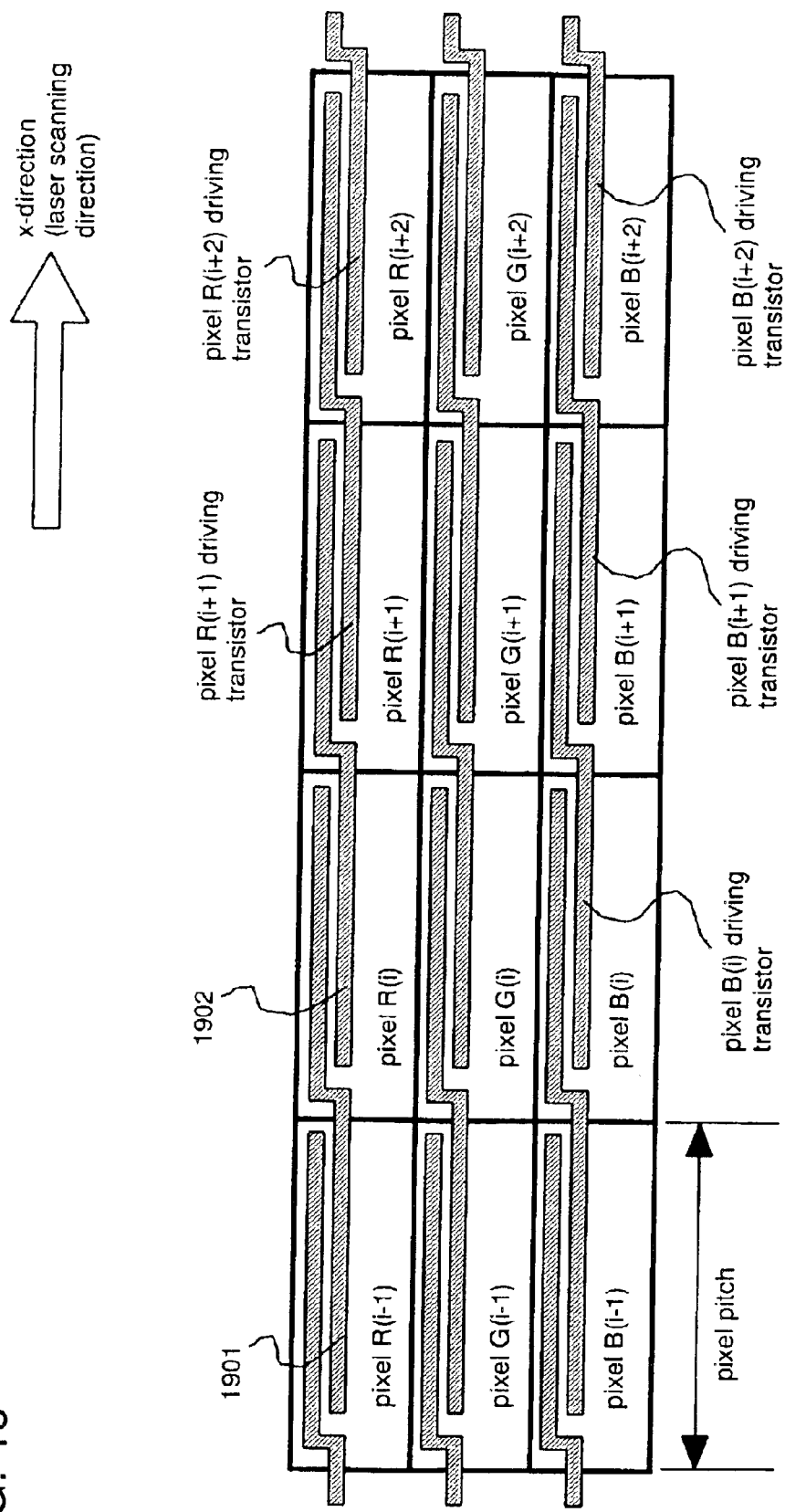
FIG. 19 is a schematic diagram showing arrangement of transistors of the present invention.

In this embodiment mode, novel arrangement for pixels will be described with reference to FIGS. 19 to 22. The pixels are arranged in the lateral direction in order of red, green, and blue in accordance with the normal stripe arrangement. FIG. 19 is a schematic diagram of arrangement of transistors in pixels when the pixels are arranged longitudinal direction in order of red, green, and blue. FIG. 19 shows four pixels arranged longitudinal direction in order of red, green, and blue in accordance with the stripe arrangement. However, the number of pixels in FIG. 19 will be twelve if one pixel is to have one color. For discrimination, the R color portion of the first pixel from left of FIG. 19 is referred to as pixel R(i-1), the G color portion thereof is pixel G(i-1), and the B color portion thereof is pixel B(i-1). Similarly, the R color portion of the second pixel from left is referred to as pixel R(i), the G color portion thereof is G(i), and the B color portion thereof is pixel B(i). The R color portion of the third pixel from left is referred to as pixel R(i+1), the G color portion thereof is G(i+1), and the B color portion thereof is pixel B(i+1). The R color portion of the fourth pixel from left is referred to as pixel R(i+2), the G color portion thereof is G(i+2), and the B color portion thereof is pixel B(i+2).

Each pixel has transistors. For instance, the pixel R(i-1) has a transistor for driving a light emitting element of the pixel. This transistor is called a pixel R(i-1) driving transistor 1901. The same applies to the rest of the pixels.

In this embodiment mode, a driving transistor of each pixel is extended lateral direction and arranged over a region of an adjacent pixel as shown in FIG. 19. To be specific, the pixel R(i-1) driving transistor 1901 is extended to a region of the pixel R(i). Similarly, the pixel R(i) driving transistor 1902 is extended to a region of the pixel R(i+1). Thus a driving transistor of one pixel is placed not only on the one pixel but also on a region of an adjacent pixel.

Here, as shown in FIG. 30, the laser scan pitch is given as M, the pixel pitch as N, and the transistor length as Z. Then a transistor is irradiated with laser light Z/M times. Since Z>N, Z/M is larger than N/M (Z/M>N/M).

The number of times of laser light irradiation is thus increased and therefore fluctuation in transistor itself can be reduced. Conversely, if the transistor length Z is sufficiently long, the laser scan pitch M can be set slightly larger than that in prior art. This makes it possible to reduce the laser light irradiation number for irradiating the entire pixel portion. However, in FIG. 1, the transistor length Z starts in one pixel and ends in an adjacent pixel, meaning that the scan pitch M is preferably set twice or less in order to increase the number of times the transistor is irradiated. As a result, processing speed in manufacture of a semiconductor is raised and manufacture cost is accordingly lowered.

Figure 20:
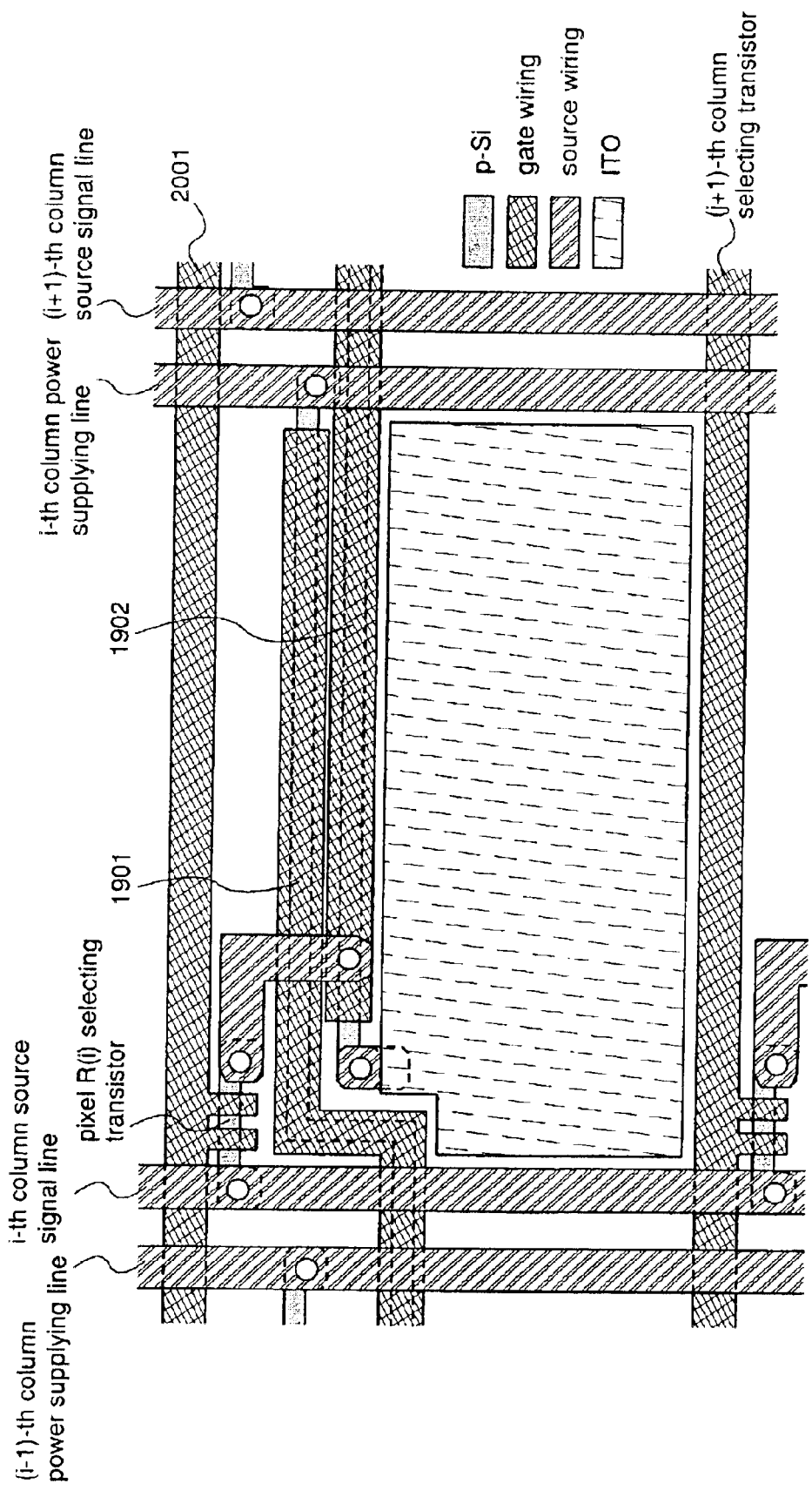
FIG. 20 is a diagram showing layout of circuits of the present invention.
Figure 21:
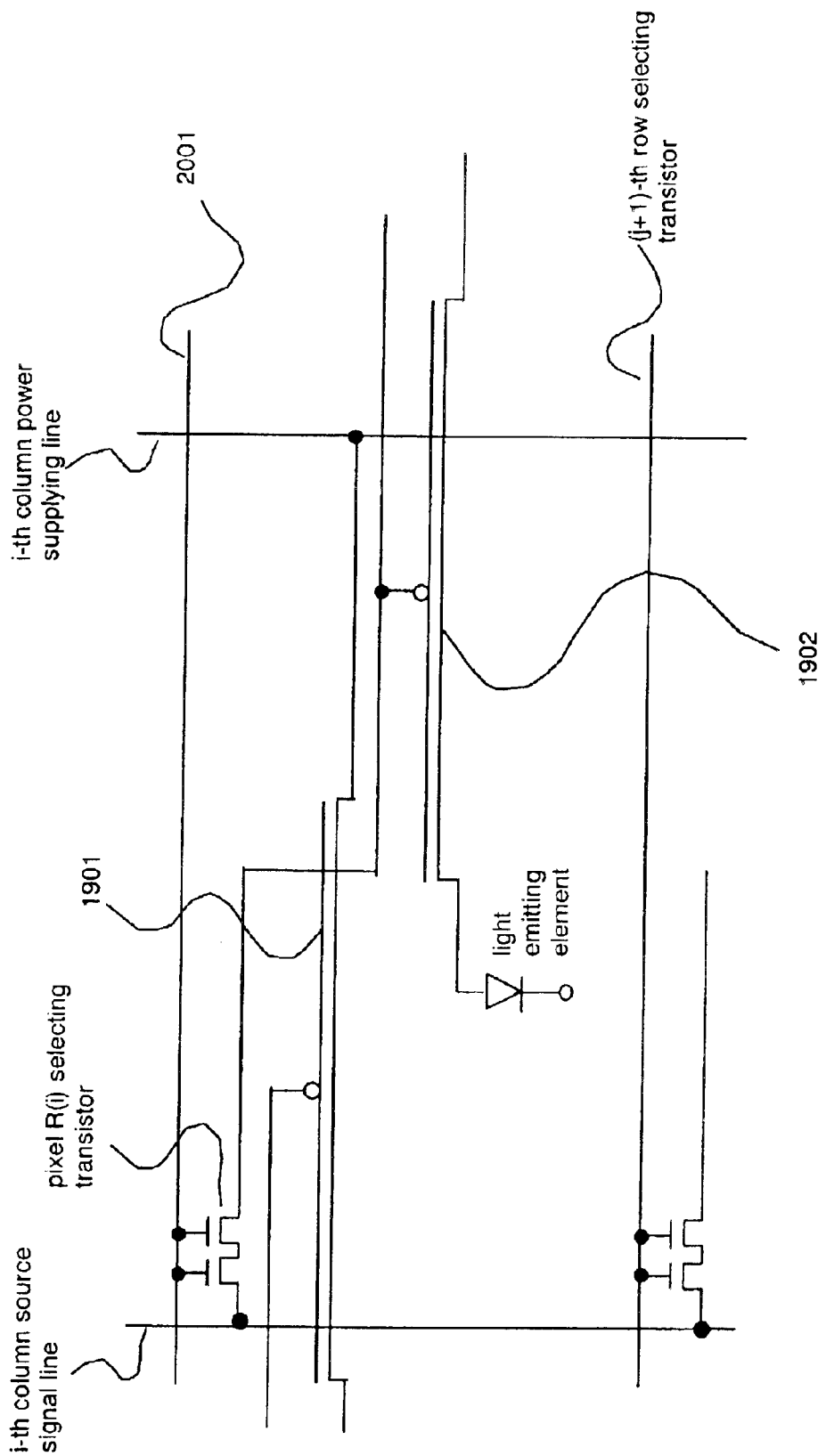
FIG. 21 is a circuit diagram for circuits of the present invention.

FIG. 19 is a layout diagram for the pixel in FIG. 20. The pixel R(i) is shown as an example in FIG. 20. A circuit diagram for FIG. 20 is FIG. 21. FIGS. 19 to 21 use the same symbols for identical components.

Features of FIG. 20 are as follows.

The first feature is that a driving transistor is arranged in parallel to a selecting gate line. For example, each driving transistor is placed in parallel to a j-th row selecting gate line 2001. This makes it easy to set the length of a driving transistor long.

Colors of the pixels are arranged longitudinal direction in order of red, green, and blue. As a result, when the driving transistors are arranged lateral direction, it becomes easy to set the length of a driving transistor long.

By connecting driving transistors in this way, a driving transistor, or in a more accurate term, a channel formation region of a driving transistor can have a length larger than the pixel pitch.

Described above is an example of placing each transistor in two pixels. However, the present invention is not limited thereto. Each transistor may be extended over more than two pixels.

Figure 22:
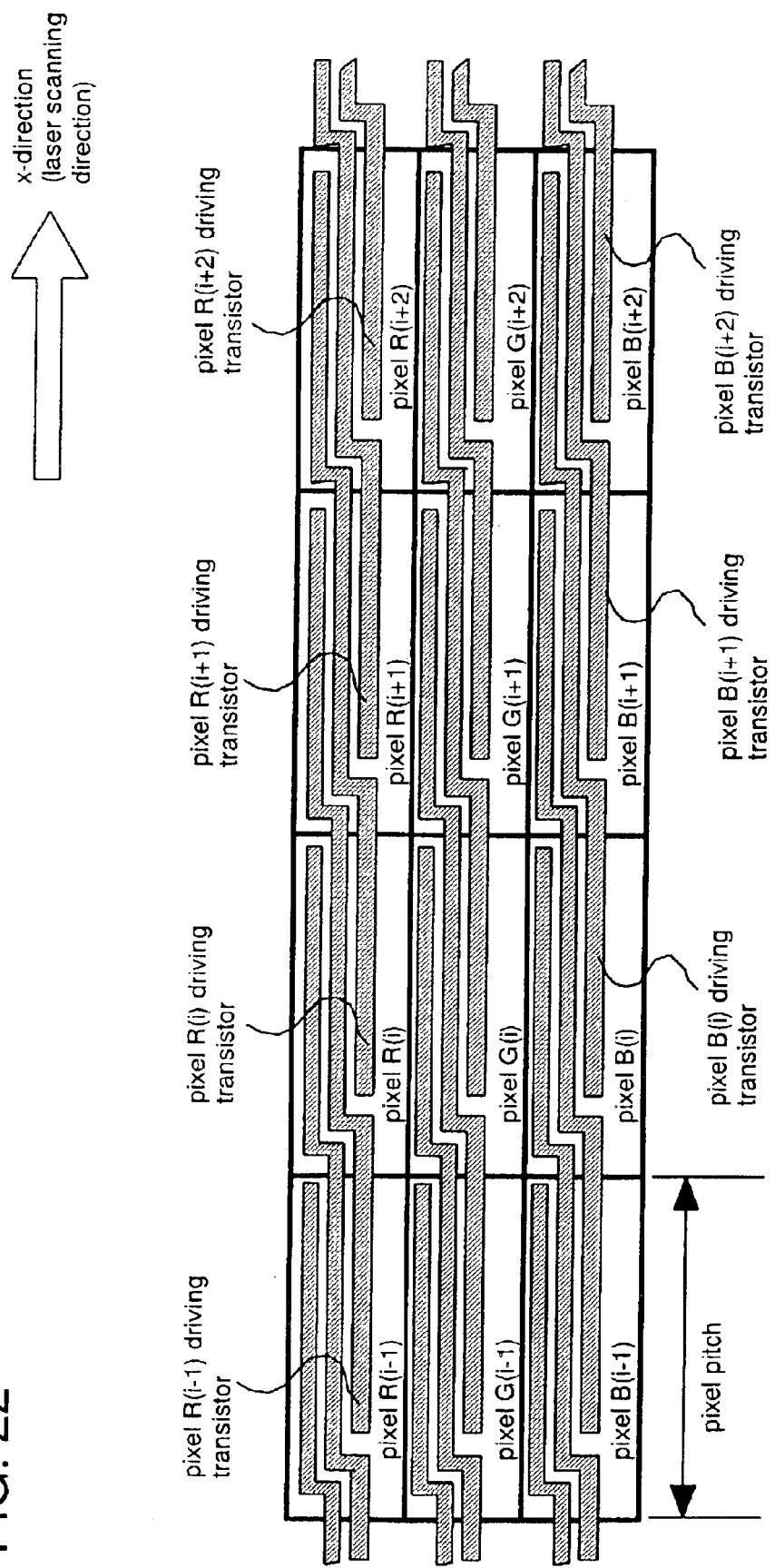
FIG. 22 is a schematic diagram showing arrangement of transistors of the present invention.

An example of placing a transistor in more than two pixels is shown in FIG. 22, where each transistor is extended over three pixels.

Arrangement of transistors shown in FIG. 22 makes it possible to design the transistor length arbitrarily. As a result, the number of times of laser light irradiation is increased. With the laser light irradiation number increased, fluctuation in crystal state between channel formation regions of transistors is reduced and therefore fluctuation in characteristic among transistors can be lowered.

The description given in this embodiment mode is for a case of displaying a color image. However, the present invention is also applicable to monochrome display.

The description given in this embodiment mode is for a case of the stripe arrangement. The present invention is not limited thereto but is applicable to other arrangement such as the delta arrangement.

The description given in this embodiment mode is for a case of constituting a driving transistor from one transistor. However, plural transistors connected in series or parallel may operate as one driving transistor. The present invention is also applicable to a transistor arrangement which is suited to plural transistors working as one driving transistor.

The description given in this embodiment mode uses a transistor in which a gate electrode is formed above a channel formation region as shown in FIGS. 15A and 15B, namely, a top gate transistor. However, the present invention is also applicable to a bottom gate transistor in which a gate electrode is formed below a channel formation region as shown in FIGS. 35A and 35B, and any other transistor structure. This is because the present invention does not depend on the structure of a transistor.

The description given in this embodiment mode is for a pixel circuit structure in which one pixel has two transistors: a selecting transistor and a driving transistor. However, the present invention is also applicable to other circuit structures. Examples thereof include structures shown in FIGS. 33A and 33B and FIGS. 34A and 34B or in JP 2001-343933 A, U.S. Pat. No. 6,229,506 B1, JP 11-219146 A, JP 2001-147659 A, etc. In short, the present invention does not depend on the circuit structure and is applicable to any circuit structure. Among various circuit structures, the present invention is particularly effective to a transistor that influences performance of the device and a transistor that is easily affected by fluctuation.

Other characteristics of the present invention than those described above are given below. A semiconductor device of the present invention has a plurality of transistors arranged to form a matrix pattern, and each transistor has a semiconductor crystallized by laser light irradiation. Each channel formation region of the plural transistors is placed so as to stretch in the first direction. Of the plural transistors, at least two transistors adjacent to each other in the second direction perpendicular to the first direction have a positional relation that makes them staggered in the second direction.

The first direction corresponds to the laser scanning direction. Also, the laser scanning direction corresponds to a direction in which carriers move in a channel formation region of a transistor when a semiconductor is arranged so as to set the channel length long. In an example of carrying out the present invention, a semiconductor is placed on two or three pixels as the one in the pixel R(i-1) driving transistor 101 of FIG. 1 and the one in the pixel R(i-1) transistor 501 of FIG. 5. This way semiconductors occupy only a small area in a pixel despite the channel length of each semiconductor of transistors being larger than the pixel pitch. The semiconductor shape is not limited to those shown in the above; a semiconductor can take any shape as far as the length of the semiconductor is larger than the pixel pitch. The channel length L or channel width W of a channel formation region is extended, or both are extended at the same time.

Embodiment 1

Figure 23:
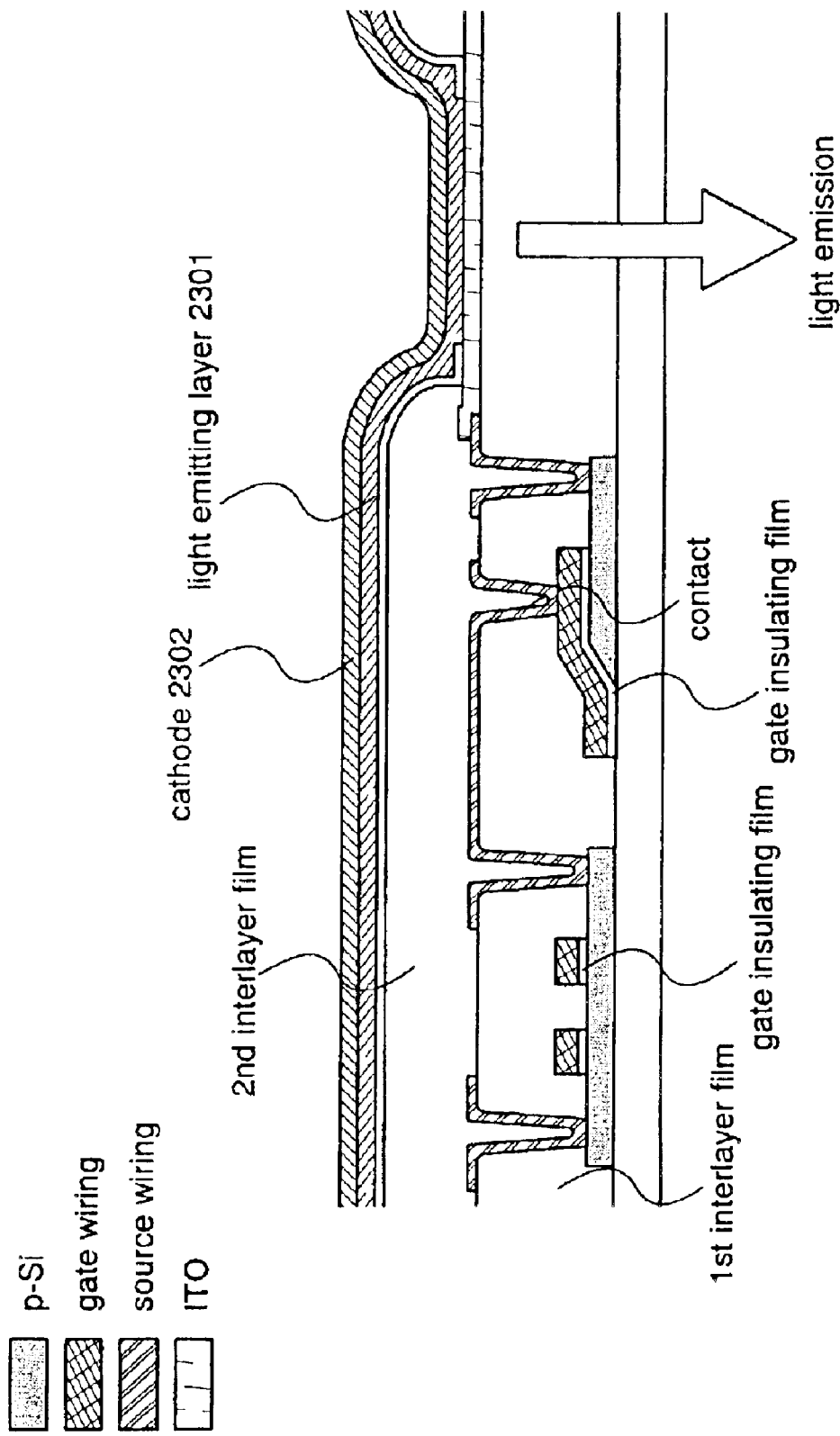
FIG. 23 is a sectional view of a semiconductor device of the present invention.
Figure 24:
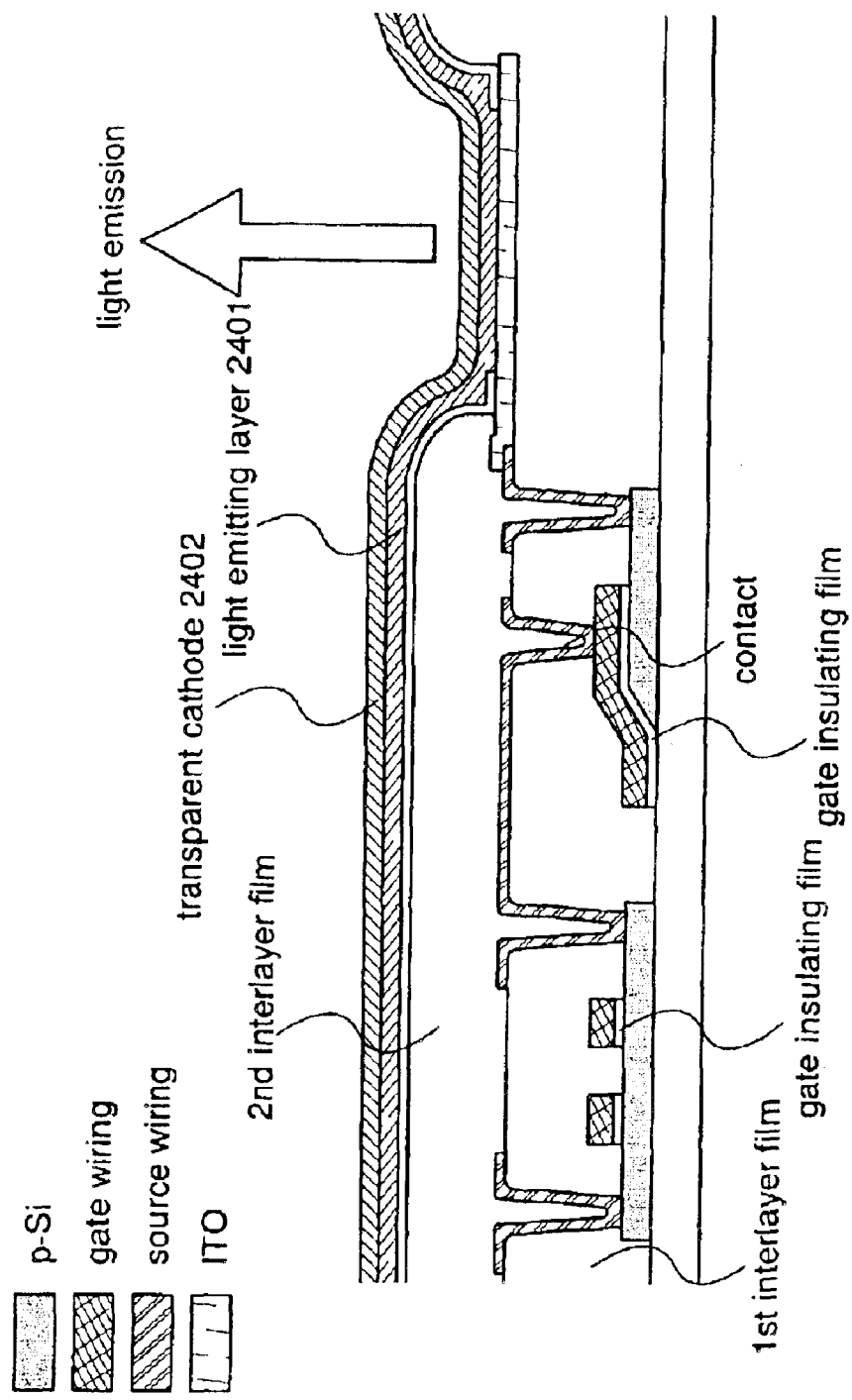
FIG. 24 is a sectional view of a semiconductor device of the present invention.

The cross-sectional view in this specification has showed only up to an ITO layer. Next, a cross-sectional view that includes light emitting element is shown. In FIG. 23, a cross-sectional view shows that light is emitted toward a bottom, that is, a glass. In FIG. 24, a cross-sectional view shows that light is emitted toward a top.

In FIG. 23, a light emitting layer 2301 is laminated on an ITO, and a cathode 2302 is laminated thereon. Materials that are made using known technique are laminated to form the structure of light emitting layer 2301.

As an example of the light emitting layer 2301, there is a layer in which a hole injection layer, a hole transporting layer, a light emitting layer, an electron transporting layer, and an electron injection layer are laminated is widely used.

In FIG. 24, a light emitting layer 2401 is laminated on an anode wiring. A cathode which is transparent to light, that is, a transparent cathode 2402 is formed thereon, however, an anode can be replaced by the cathode.

This cross-sectional structure can be formed using known technique. This embodiment can be used for above-mentioned Embodiment Modes 1 to 5. Therefore, a semiconductor device of the present invention can display an image.

Embodiment 2

A light emitting device using a light emitting element as a light emitting display is a self light emission type. Thus, such a light emitting device has high visibility in a light place and a wide viewing angle, as compared with a liquid crystal display. Therefore, it can be used for a display portion of various electronic devices.

As electronic devices using a light emitting display of the present invention, there are a video camera, a digital camera, a goggle type display (head mount display), a navigation system, a sound reproducing device (car audio system, audio component system, or the like), a laptop personal computer, a game machine, a portable information terminal (mobile computer, mobile telephone, portable game machine, an electric book, or the like), an image reproducing device including a recording medium (specifically, apparatus for reproducing an image from a recording medium such as a digital versatile disc (DVD), which includes a display capable of displaying the image), and the like. In particular, in the case of the portable information terminal in which a screen is viewed from an oblique direction in many cases, it is important that a view angle is large. Thus, it is desirable that the light emitting device is used. Concrete examples of those electronic devices are shown in FIGS. 25A to 25H.

Figure 25A:
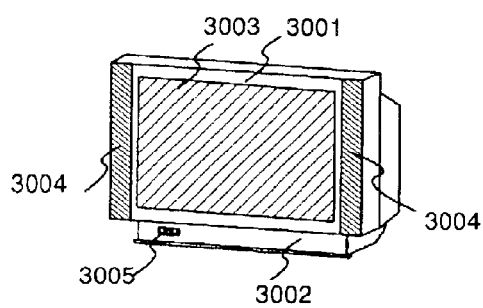
FIGS. 25A to 25H are diagrams of electronic equipment using a semiconductor device of the present invention.

FIG. 25A shows a display device which includes a cabinet 3001, a support base 3002, a display portion 3003, a speaker portion 3004, and a video input terminal 3005. The light emitting display of the present invention can be used for the display portion 3003. The light emitting device is a self light emission type and thus does not require a back light. Therefore, a thinner display portion than a liquid crystal display can be obtained. Further, the display device includes all display devices for information display such as personal computer, TV broadcast receiving, and advertisement display.

Figure 25B:
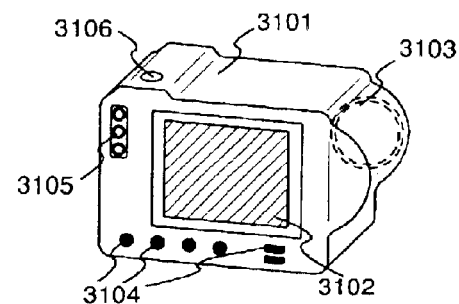

FIG. 25B is a digital still camera, which is composed of a main body 3101, a display portion 3102, an image-receiving portion 3103, operation keys 3104, external connection ports 3105, a shutter 3106, and the like. The semiconductor device of the present invention can be used in the display portion 3102.

Figure 25C:
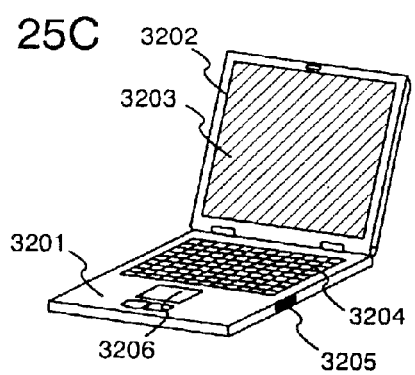

FIG. 25C is a notebook personal computer, which is composed of a main body 3201, a frame 3202, a display portion 3203, a keyboard 3204, external connection ports 3205, a pointing mouse 3206, and the like. The semiconductor device of the present invention can be used in the display portion 3203.

Figure 25D:
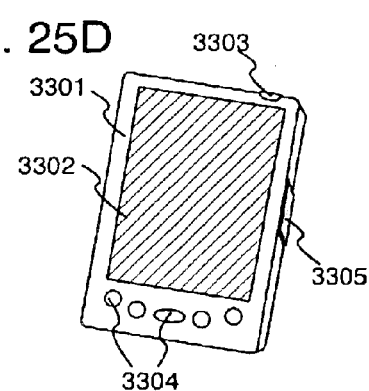

FIG. 25D is a mobile computer, which is composed of a main body 3301, a display portion 3302, a switch 3303, operation keys 3304, an infrared port 3305, and the like. The semiconductor device of the present invention can be used in the display portion 3302.

Figure 25E:
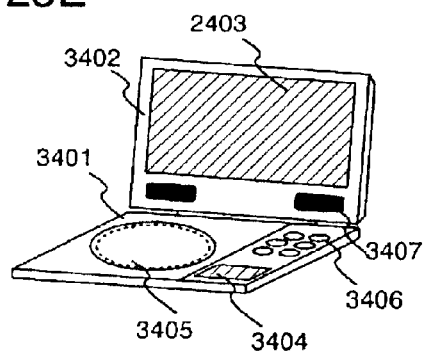

FIG. 25E is a portable image reproducing device equipped with a recording medium (specifically, a DVD player), and is composed of a main body 3401, a frame 3402, a display portion A 3403, a display portion B 3404, a recording medium (such as a DVD) read-in portion 3405, operation keys 3406, a speaker portion 3407, and the like. The display portion A 3403 mainly displays image information, and the display portion B 3404 mainly displays character information, and the semiconductor device of the present invention can be used in the display portion A 3403 and in the display portion B 3404. Note that family game machines and the like are included in the category of image reproducing devices provided with a recording medium.

Figure 25F:
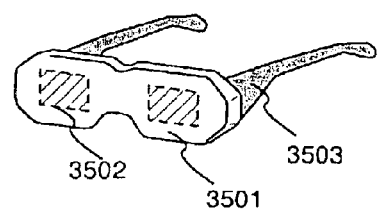

FIG. 25F is a goggle type display device (head mounted display), which is composed of a main body 3501, a display portion 3502, and an arm portion 3503. The semiconductor device of the present invention can be used in the display portion 3502.

Figure 25G:
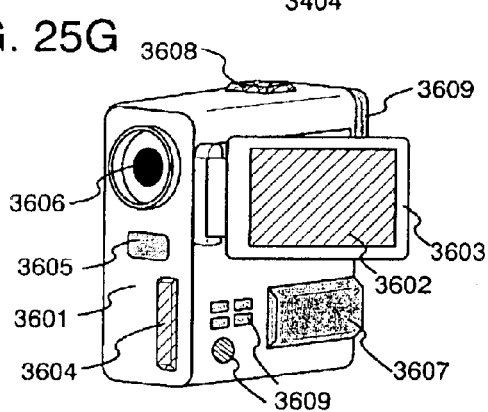

FIG. 25G is a video camera, which is composed of a main body 3601, a display portion 3602, a frame 3603, external connection ports 3604, a remote control receiving portion 3605, an image receiving portion 3606, a battery 3607, an audio input portion 3608, operation keys 3609, and the like. The semiconductor device of the present invention can be used in the display portion 3602.

Figure 25H:
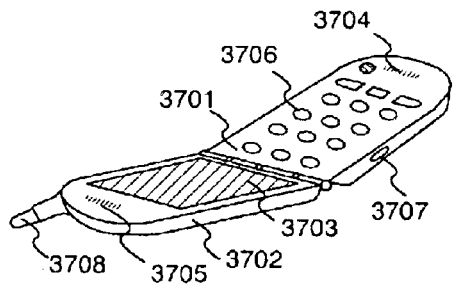
Figure 26:
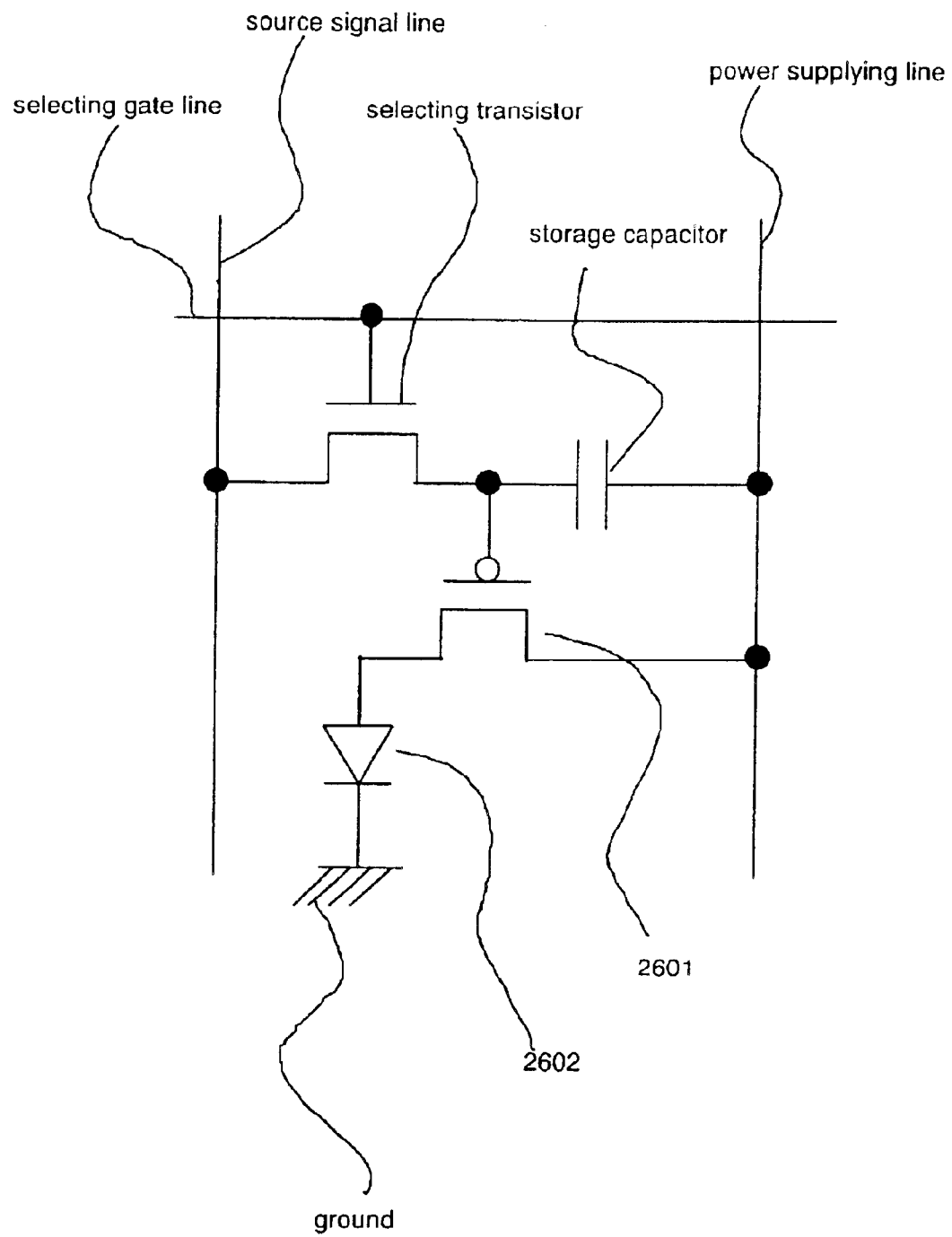
FIG. 26 is a circuit diagram of a conventional pixel.
Figure 27A:
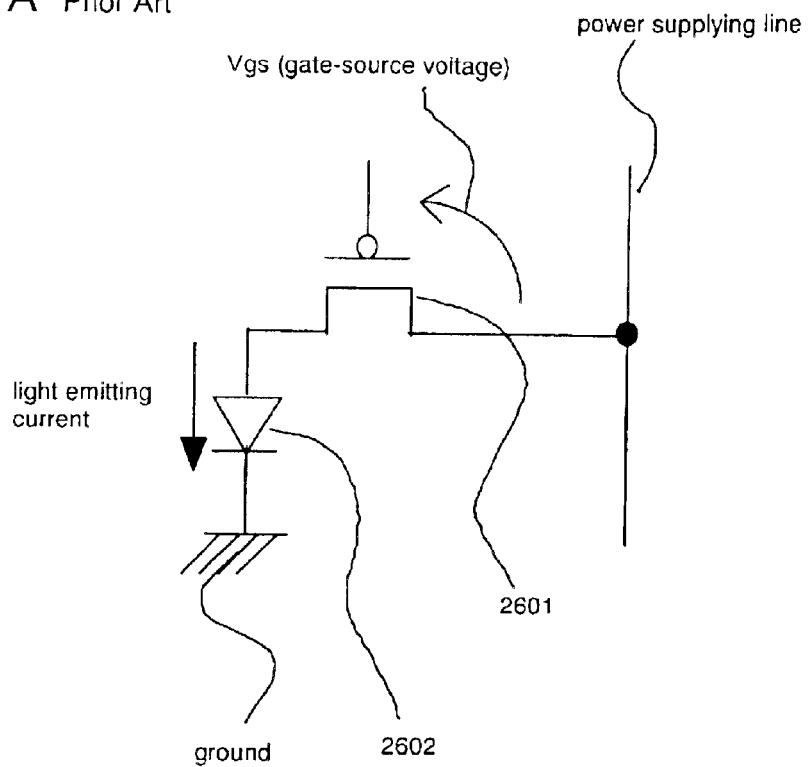
FIGS. 27A and 27B are diagrams showing the operation of a conventional pixel.
Figure 27B:
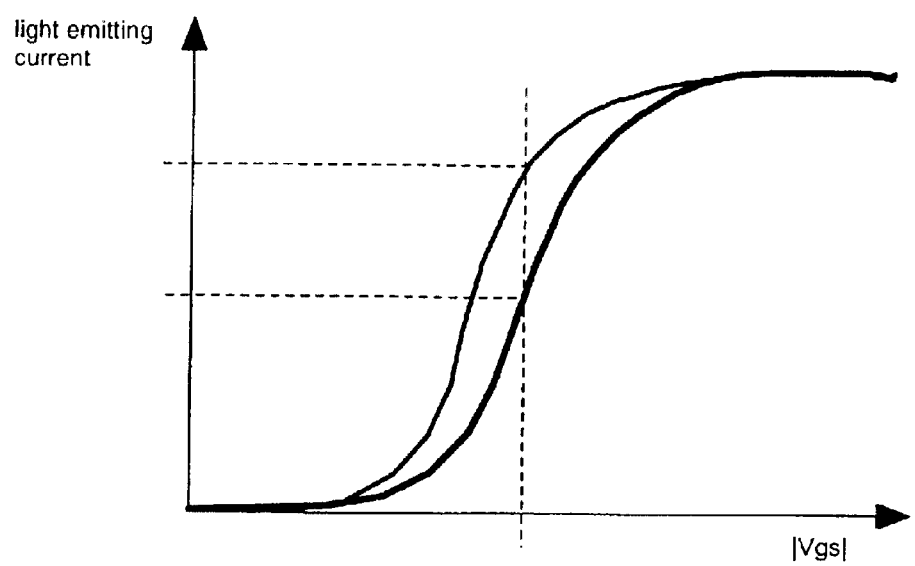
Figure 28:
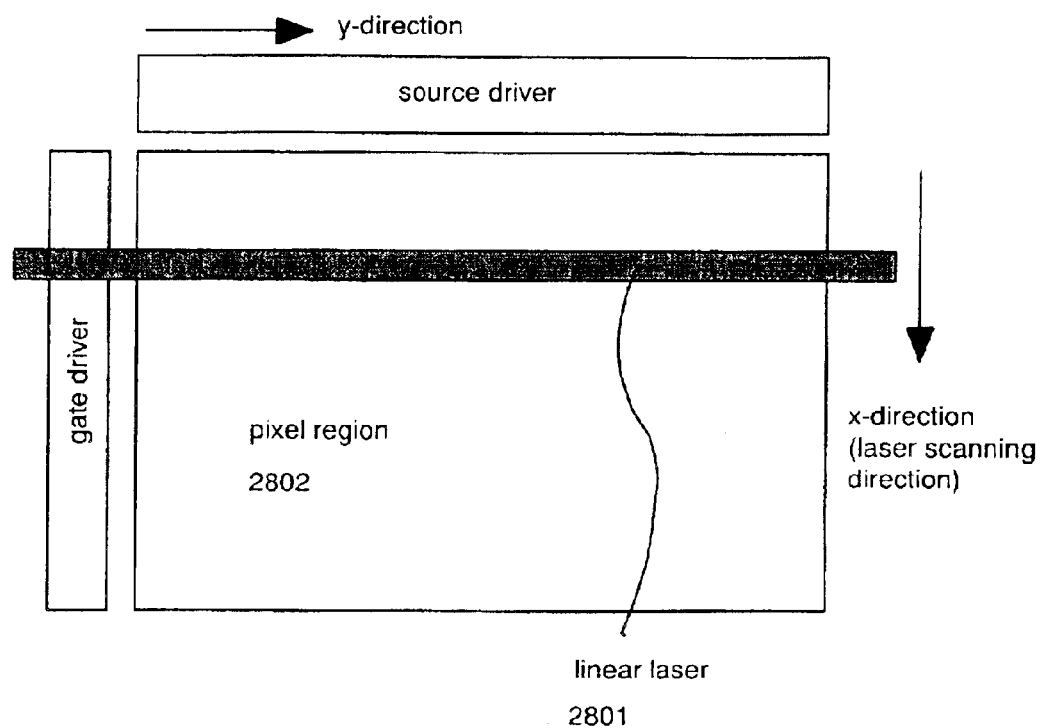
FIG. 28 is a schematic diagram showing conventional laser light irradiation.
Figure 29A:
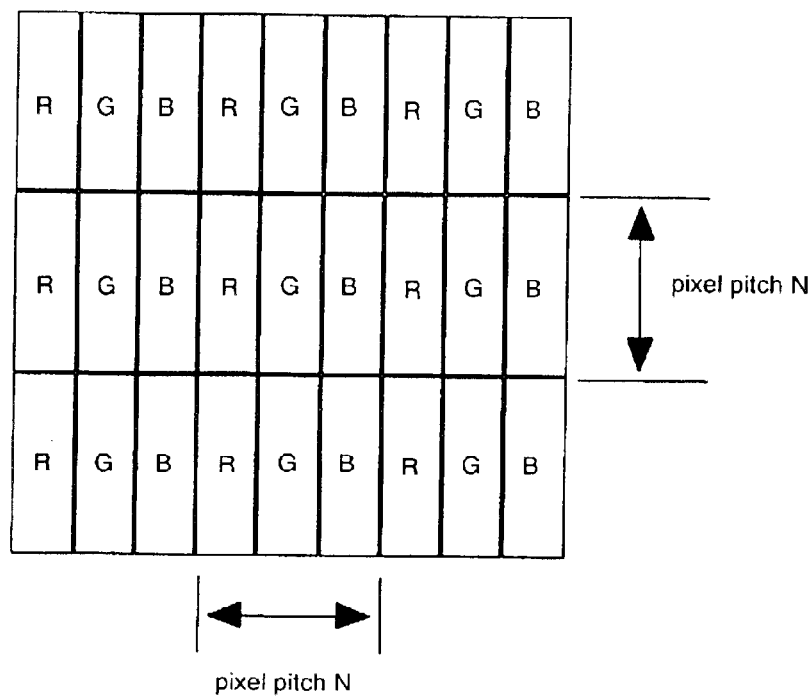
FIGS. 29A and 29B are diagrams showing conventional arrangement of pixels.
Figure 29B:
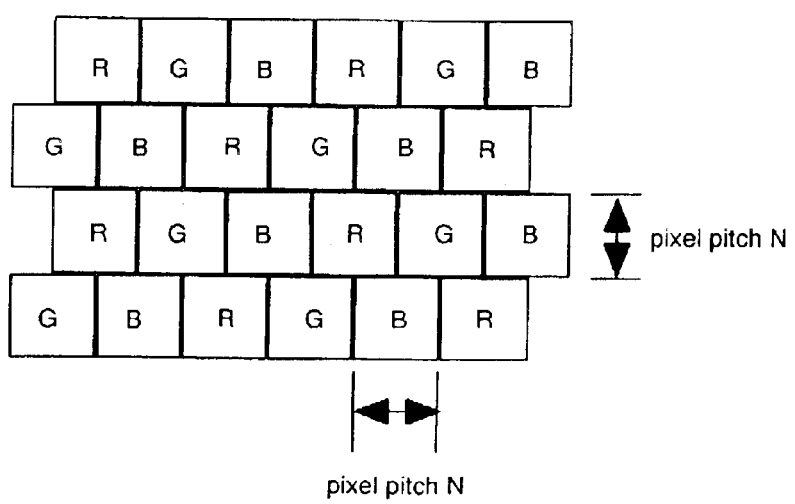

FIG. 25H is a mobile telephone, which is composed of a main body 3701, a frame 3702, a display portion 3703, an audio input portion 3704, an audio output portion 3705, operation keys 3706, external connection ports 3707, an antenna 3708, and the like. The semiconductor device of the present invention can be used in the display portion 3703. Note that white characters are displayed on a black background in the display portion 3703, and thus, the power consumption of the mobile telephone can be suppressed.

Note that, when a light emitting intensity of an organic light emitting material is increased in future, it can be used for a front type or a rear type projector for magnifying and projecting outputted light including image information by a lens or the like.

Also, in the above electronic devices, the number of cases where information distributed through an electronic communication line such as an Internet or a CATV (cable television) is displayed is increased. In particular, an opportunity in which moving image information is displayed is increased. A response speed of the organic light emitting material is very high. Thus, the light emitting device is preferable for moving image display.

Also, with respect to the light emitting device, power is consumed in a portion which emits light. Thus, it is desirable that information is displayed so as to minimize an area of a light emitting portion. Accordingly, when the light emitting device is used for a display portion of, a portable information terminal, particularly, a mobile telephone or a sound reproducing device in which character information is mainly displayed, it is desirable that the light emitting device is driven so as to use a non-light emitting portion as a background and produce character information in a light emitting portion.

As described above, an application area of the present invention is extremely wide and can be used for electronic devices in all fields.

In the present invention, a plurality of transistors are arranged to form a matrix pattern, and each transistor has a semiconductor crystallized by laser light irradiation. Each channel formation region of the plural transistors is placed so as to stretch in a first direction (the laser scanning direction). Of the plural transistors, at least two transistors adjacent to each other in a second direction that is perpendicular to the first direction have a positional relation that makes them staggered in the second direction. Each semiconductor of the plural transistors has a shape obtained by combining two shapes: a shape axisymmetric to capital letter L and a shape axisymmetric to half-turned capital letter L, and is extended over two pixels. This way semiconductors occupy only a small area in a pixel despite the channel length of each semiconductor of transistors being larger than the pixel pitch.

In the present invention, semiconductors are placed in parallel to Direction x (the laser light scanning direction) to even out fluctuation in characteristic between a transistor in one point in Direction x (the laser light scanning direction) and a transistor in another point. By arranging transistors in parallel to Direction x (the laser light scanning direction), channel formation regions of the transistors are irradiated with a laser in an increased number of times. This reduces fluctuation in crystal state between channel formation regions in transistors, whereby fluctuation in characteristic among the transistors is lowered.

Furthermore, in the present invention, each semiconductor is arranged so as to stretch over at least two pixels in order to increase the number of times the semiconductor is irradiated with a laser. This makes the length of the semiconductor larger than the pixel pitch of the pixels. By thus increasing the transistor size and setting a channel length L larger than the channel width, fluctuation in transistor itself can be reduced.

If the pixel pitch is increased in future, the semiconductor length can be set even longer and therefore the laser light irradiation number is further increased. As a result, fluctuation among transistors that have those semiconductors is reduced and the present invention will have even greater effects.

The width and length of laser light and the laser scan pitch in irradiating the semiconductors are not particularly limited. However, since the semiconductors are irradiated with laser light an increased number of times in the present invention, widening the laser light and measures to the similar effect are preferable. This makes it possible to further reduce fluctuation in crystal state between channel formation regions of the transistors and therefore fluctuation in characteristic among the transistors can be reduced even more. If each semiconductor is sufficiently long, the laser light irradiation number for each semiconductor can be satisfactorily large and fluctuation among transistors is reduced even when the laser scan pitch is somewhat larger. In this way, a semiconductor device is manufactured without increasing the total number of laser light irradiation for irradiating the entire pixel portion. As a result, processing speed in manufacture of a semiconductor device is raised and therefore the cost is lowered.

What is claimed is:

1. A semiconductor device comprising a plurality of transistors which form a matrix pattern, comprising:
   wherein the plurality of transistors have semiconductor films crystallized by a laser light irradiation,
   wherein each of the semiconductor films extends over at least two pixels,
   wherein each channel formation region of the plurality of transistors is placed so as to extend in a first direction, and
   wherein, among the plurality of transistors, at least two transistors which are adjacent to each other in a second direction that is perpendicular to the first direction have a positional relation that makes them staggered in the second direction.

2. A semiconductor device according to claim 1, wherein the first direction is a direction in which electric charges move in the channel formation regions of the transistors.

3. A semiconductor device according to claim 1, wherein a direction in which electric charges move in the channel formation regions of the plurality of transistors is parallel to a scanning direction of the laser light.

4. A semiconductor device according to claim 1, wherein the semiconductor device is at least one selected from the group consisting of a digital camera, a personal computer, a mobile computer, an image reproducing device, a goggle type display, a video camera, and a mobile telephone.

5. A semiconductor device comprising a plurality of transistors which form a matrix pattern,
   wherein the plurality of transistors have semiconductor films crystallized by a laser light irradiation,
   wherein each of the semiconductor films extends over at least two pixels,
   wherein each channel formation region of the plurality of transistors is placed so as to extend in a first direction,
   wherein, among the plurality of transistors, at least two transistors which are adjacent to each other in a second direction that is perpendicular to the first direction have a positional relation that makes them staggered in the second direction, and
   wherein, among the semiconductor films of the plurality of transistors, at least two semiconductor films which are adjacent to each other in the second direction have a same crystal state.

6. A semiconductor device according to claim 5, wherein the first direction is a direction in which electric charges move in the channel formation regions of the transistors.

7. A semiconductor device according to claim 5, wherein a direction in which electric charges move in the channel formation regions of the plurality of transistors is parallel to a scanning direction of the laser light.

8. A semiconductor device according to claim 5, wherein the semiconductor device is at least one selected from the group consisting of a digital camera, a personal computer, a mobile computer, an image reproducing device, a goggle type display, a video camera, and a mobile telephone.

9. A semiconductor device comprising a plurality of pixels having transistors forming a matrix pattern,
   wherein the transistors have semiconductor films crystallized by a laser light irradiation,
   wherein each of the semiconductor films extends over at least two pixels,
   wherein a length of each of the semiconductor films is longer than a pixel pitch of the pixels, and
   wherein, when a scan pitch of the laser light is given as M and the pixel pitch of the pixels is given as N, each of the semiconductor films is irradiated with the laser light N/M times or more.

10. A semiconductor device according to claim 9, wherein a direction in which electric charges move in channel formation regions of the plurality of transistors is parallel to a scanning direction of the laser light.

11. A semiconductor device according to claim 9, wherein the semiconductor device is at least one selected from the group consisting of a digital camera, a personal computer, a mobile computer, an image reproducing device, a goggle type display, a video camera, and a mobile telephone.

12. A semiconductor device having a plurality of pixels and wires, the pixels having transistors, the pixels and the wires forming a matrix pattern,
    wherein the transistors have semiconductor films crystallized by a laser light irradiation,
    wherein each of the semiconductor films extends in parallel to the wires and extends over at least two pixels,
    wherein a length of each of the semiconductor films is longer than a pixel pitch of the pixels, and
    wherein, when a scan pitch of the laser light is given as M and the pixel pitch of the pixels is given as N, each of the semiconductor films is irradiated with the laser light N/M times or more.

13. A semiconductor device according to claim 12, wherein a direction in which electric charges move in channel formation regions of the plurality of transistors is parallel to a scanning direction of the laser light.

14. A semiconductor device according to claim 12, wherein the semiconductor device is at least one selected from the group consisting of a digital camera, a personal computer, a mobile computer, an image reproducing device, a goggle type display, a video camera, and a mobile telephone.

15. A semiconductor device comprising:
    a first transistor having at least a first channel region; and
    a second transistor having at least a second channel region,
    wherein the first channel region and the second channel region are adjacent to each other, and
    wherein the first channel region and the second channel region extend in one direction, and partially overlap with each other.

16. A semiconductor device according to claim 15, wherein the semiconductor device is at least one selected from the group consisting of a digital camera, a personal computer, a mobile computer, an image reproducing device, a goggle type display, a video camera, and a mobile telephone.

17. A semiconductor device comprising:
    a first transistor having at least a first channel region; and
    a second transistor having at least a second channel region,
    wherein the first channel region and the second channel region are adjacent to each other,
    wherein the first channel region and the second channel region extend in one direction, and partially overlap with each other, and
    wherein the first channel region and the second channel region have a same crystal state.

18. A semiconductor device according to claim 17, wherein the semiconductor device is at least one selected from the group consisting of a digital camera, a personal computer, a mobile computer, an image reproducing device, a goggle type display, a video camera, and a mobile telephone.

19. A semiconductor device comprising a plurality of pixels having transistors, wherein the transistors have semiconductor films, wherein each of the semiconductor films extends over at least two pixels, and wherein a length of each of the semiconductor films is longer than a pixel pitch of the pixels.

20. A semiconductor device according to claim 19, wherein the semiconductor device is at least one selected from the group consisting of a digital camera, a personal computer, a mobile computer, an image reproducing device, a goggle type display, a video camera, and a mobile telephone.

21. A semiconductor device having a plurality of pixels and wires, the pixels having transistors, wherein the transistors have semiconductor films, wherein each of the semiconductor films extends in parallel to the wires and extends over at least two pixels, and wherein a length of each of the semiconductor films is longer than a pixel pitch of the pixels.

22. A semiconductor device according to claim 21, wherein the semiconductor device is at least one selected from the group consisting of a digital camera, a personal computer, a mobile computer, an image reproducing device, a goggle type display, a video camera, and a mobile telephone.

* * * * *